US008669703B2

(12) United States Patent
Hillis et al.

(10) Patent No.: US 8,669,703 B2
(45) Date of Patent: Mar. 11, 2014

(54) SELF ASSEMBLY OF ELEMENTS FOR DISPLAYS

(75) Inventors: W. Daniel Hillis, Encino, CA (US); Nathan P. Myhrvold, Medina, WA (US); Clarence T. Tegreene, Bellevue, WA (US); Lowell L. Wood, Jr., Livermore, CA (US); Victoria Y. H. Wood, Livermore, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 1014 days.

(21) Appl. No.: 12/590,796

(22) Filed: Nov. 13, 2009

(65) Prior Publication Data

US 2010/0117952 A1 May 13, 2010

Related U.S. Application Data

(60) Division of application No. 11/447,682, filed on Jun. 5, 2006, and a continuation-in-part of application No. 11/078,206, filed on Mar. 11, 2005, and a continuation-in-part of application No. 11/447,611, filed on Jun. 5, 2006, now Pat. No. 8,284,120, and a continuation-in-part of application No. 11/078,207, filed on Mar. 11, 2005, and a continuation-in-part of application No. 12/215,644, filed on Jun. 27, 2008, and a continuation-in-part of application No. 11/099,409, filed on Apr. 4, 2005, and a continuation-in-part of application No. 11/497,793, filed on Aug. 2, 2006, now Pat. No. 8,300,007, and a continuation-in-part of application No. 11/113,453, filed on Apr. 22, 2005, now Pat. No. 7,990,349, and a continuation-in-part of application No. 11/449,516, filed on Jun. 7, 2006, now Pat. No. 8,508,434, and a continuation-in-part of application No. 12/583,511, filed on Aug. 20, 2009, now Pat. No. 8,334,819, and a continuation-in-part of application No. 11/099,682, filed on Apr. 4, 2005, now Pat. No. 7,662,008, and a continuation-in-part of application No. 11/499,247, filed on Aug. 3, 2006, now Pat. No. 7,977,130, and a continuation-in-part of application No. 12/590,779, filed on Nov. 13, 2009, now Pat. No. 8,570,482.

(51) Int. Cl.
*A01K 7/00* (2006.01)

(52) U.S. Cl.
USPC .......................................... 313/513; 345/107

(58) Field of Classification Search
USPC ............. 313/513; 354/107; 156/73.6; 445/22
See application file for complete search history.

(56) References Cited

U.S. PATENT DOCUMENTS 4,843,191 A 6/1989 Thomas
4,911,536 A 3/1990 Ditzik (Continued)

FOREIGN PATENT DOCUMENTS

JP 59-126967 A 7/1984

OTHER PUBLICATIONS

Agache, Vincent; Quévy, Emmanuel; Collard, Dominique; Buchaillot, Lionel; "Stiction-controlled locking system for three-dimensional self-assembled microstructures: Theory and experimental validation"; Applied Physics Letters; bearing dates of Dec. 3, 2001, Jul. 9, 2001, Sep. 20, 2001, 2001; Jan. 24, 2005; vol. 79, No. 23; pp. 3869-3871; American Institute of Physics.

(Continued)

*Primary Examiner* — Anh Mai
*Assistant Examiner* — Brenitra M Lee
(74) *Attorney, Agent, or Firm* — Suiter Swantz pc llo

(57) ABSTRACT

Various embodiments of methods and systems for designing and constructing displays from multiple light emitting elements are disclosed. Display elements having different light emitting and self-organizing characteristics may be used during display assembly.

26 Claims, 28 Drawing Sheets

(56) References Cited

U.S. PATENT DOCUMENTS

| | | | |
|---|---|---|---|
| 5,032,879 | A | 7/1991 | Buchmann et al. |
| 5,093,654 | A | 3/1992 | Swift et al. |
| 5,177,628 | A | 1/1993 | Moddel |
| 5,267,863 | A | 12/1993 | Simmons, Jr. |
| 5,289,171 | A | 2/1994 | Nire et al. |
| 5,298,892 | A | 3/1994 | Shapiro et al. |
| 5,355,577 | A | 10/1994 | Cohn |
| 5,371,618 | A | 12/1994 | Tai et al. |
| 5,545,291 | A | 8/1996 | Smith et al. |
| 5,548,282 | A | 8/1996 | Escritt et al. |
| 5,596,434 | A | 1/1997 | Walba et al. |
| 5,821,138 | A | 10/1998 | Yamazaki et al. |
| 5,904,545 | A | 5/1999 | Smith et al. |
| 5,917,280 | A | 6/1999 | Burrows et al. |
| 6,125,226 | A | 9/2000 | Forrest et al. |
| 6,180,239 | B1 | 1/2001 | Whitesides et al. |
| 6,232,714 | B1 | 5/2001 | Shen et al. |
| 6,243,131 | B1 | 6/2001 | Martin |
| 6,274,508 | B1 | 8/2001 | Jacobsen et al. |
| 6,274,980 | B1 | 8/2001 | Burrows et al. |
| 6,281,038 | B1 | 8/2001 | Jacobsen et al. |
| 6,291,266 | B1 | 9/2001 | Sayyah |
| 6,291,896 | B1 | 9/2001 | Smith |
| 6,316,278 | B1 | 11/2001 | Jacobsen et al. |
| 6,420,266 | B1 | 7/2002 | Smith et al. |
| 6,462,859 | B1 | 10/2002 | Bastiaens et al. |
| 6,479,395 | B1 | 11/2002 | Smith et al. |
| 6,498,049 | B1 | 12/2002 | Friend et al. |
| 6,503,831 | B2 | 1/2003 | Speakman |
| 6,507,989 | B1 | 1/2003 | Bowden et al. |
| 6,527,964 | B1 | 3/2003 | Smith et al. |
| 6,545,422 | B1 | 4/2003 | George et al. |
| 6,555,408 | B1 | 4/2003 | Jacobsen et al. |
| 6,566,744 | B2 | 5/2003 | Gengel |
| 6,586,763 | B2 | 7/2003 | Marks et al. |
| 6,587,083 | B1 | 7/2003 | Basturk |
| 6,600,467 | B1 | 7/2003 | Webb |
| 6,606,079 | B1 | 8/2003 | Smith |
| 6,608,439 | B1 | 8/2003 | Sokolik et al. |
| 6,611,237 | B2 | 8/2003 | Smith |
| 6,618,115 | B1 | 9/2003 | Hiroki |
| 6,621,471 | B1 | 9/2003 | Ozaki et al. |
| 6,661,393 | B2 | 12/2003 | Tegreene et al. |
| 6,665,044 | B1 | 12/2003 | Jacobsen et al. |
| 6,673,398 | B2 | 1/2004 | Schneider et al. |
| 6,683,663 | B1 | 1/2004 | Hadley et al. |
| 6,693,384 | B1 | 2/2004 | Vicentini et al. |
| 6,698,077 | B2 | 3/2004 | Buchwalter et al. |
| 6,731,353 | B1 | 5/2004 | Credelle et al. |
| 6,741,386 | B2 | 5/2004 | Minami |
| 6,762,566 | B1 | 7/2004 | George et al. |
| 6,780,696 | B1 | 8/2004 | Schatz |
| 6,809,196 | B2 | 10/2004 | Bamdad et al. |
| 6,850,000 | B1 | 2/2005 | Huang et al. |
| 6,861,136 | B2 | 3/2005 | Verlinden et al. |
| 6,862,009 | B2 | 3/2005 | Park |
| 6,863,402 | B2 | 3/2005 | Roddy et al. |
| 6,864,864 | B2 | 3/2005 | Lin |
| 6,867,551 | B2 | 3/2005 | Okuda |
| 6,927,085 | B2 | 8/2005 | Hadley et al. |
| 6,979,380 | B2 | 12/2005 | Thorson et al. |
| 6,993,709 | B1 | 1/2006 | Lynn et al. |
| 6,998,644 | B1 | 2/2006 | Boling et al. |
| 7,016,704 | B2 | 3/2006 | Pallakoff |
| 7,046,328 | B2 | 5/2006 | Jacobsen et al. |
| 7,061,450 | B2 | 6/2006 | Bright et al. |
| 7,101,502 | B2 | 9/2006 | Smith et al. |
| 7,129,654 | B2 | 10/2006 | Tsai et al. |
| 7,141,176 | B1 | 11/2006 | Smith et al. |
| 7,172,789 | B2 | 2/2007 | Smith et al. |
| 7,198,411 | B2 | 4/2007 | Fujii et al. |
| 7,232,704 | B2 | 6/2007 | Singh |
| 7,244,326 | B2 | 7/2007 | Craig et al. |
| 7,262,754 | B1 | 8/2007 | Yamazaki |
| 7,321,159 | B2 | 1/2008 | Schatz |
| 7,662,008 | B2 | 2/2010 | Hillis et al. |
| 7,833,077 | B1 | 11/2010 | Simmons, Jr. |
| 2002/0027124 | A1 | 3/2002 | Bashir et al. |
| 2002/0064909 | A1 | 5/2002 | Gracias et al. |
| 2002/0070909 | A1 | 6/2002 | Asano et al. |
| 2002/0072074 | A1 | 6/2002 | Zhang et al. |
| 2002/0088985 | A1 | 7/2002 | Komoto et al. |
| 2002/0158814 | A1 | 10/2002 | Bright et al. |
| 2002/0190415 | A1 | 12/2002 | Yang et al. |
| 2003/0020757 | A1 | 1/2003 | Aratani et al. |
| 2003/0068519 | A1 | 4/2003 | Brewer et al. |
| 2003/0100837 | A1 | 5/2003 | Lys et al. |
| 2003/0117423 | A1 | 6/2003 | Brown Elliott et al. |
| 2003/0158795 | A1 | 8/2003 | Markham et al. |
| 2003/0186469 | A1 | 10/2003 | Fonstad, Jr. et al. |
| 2004/0020774 | A1 | 2/2004 | Aksay et al. |
| 2004/0023414 | A1 | 2/2004 | Zhang et al. |
| 2004/0150584 | A1 | 8/2004 | Chuman et al. |
| 2004/0179145 | A1 | 9/2004 | Jacobsen et al. |
| 2004/0227140 | A1 | 11/2004 | Lee et al. |
| 2004/0241381 | A1 | 12/2004 | Chen |
| 2005/0000634 | A1 | 1/2005 | Craig et al. |
| 2005/0106989 | A1 | 5/2005 | Rincover |
| 2005/0114902 | A1 | 5/2005 | Choi |
| 2005/0196589 | A1 | 9/2005 | Watanabe |
| 2006/0051517 | A1 | 3/2006 | Haas et al. |
| 2006/0057293 | A1 | 3/2006 | Sharma et al. |
| 2006/0132477 | A1 | 6/2006 | Kerr et al. |

OTHER PUBLICATIONS

Aizenberg, Joanna; Black, Andrew J.; Whitesides, George M.; “Control of crystal nucleation by patterned self-assembled monolayers”; Nature: letters to nature; Apr. 8, 1999; vol. 398; pp. 495-498; Macmillan Magazines Ltd.

Bowden, Ned; Choi, Insung S.; Grzybowski, Bartosz A.; Whitesides, George M.; “Mesoscale Self-Assembly of Hexagonal Plates Using Lateral Capillary Forces: Synthesis Using the “Capillary Bond””; J. Am. Chem. Soc.; bearing dates of Nov. 9, 1998, Mar. 5, 1999, May 27, 1999; pp. 5373-5391; American Chemical Society.

Breen, Tricia L.; Tien, Joe; Oliver, Scott R. J.; Hadzic, Tanja; Whitesides, George M.; “Design and Self-Assembly of Open, Regular, 3D Mesostructures”; Science; May 7, 1999; vol. 284; pp. 948-951; located at: www.sciencemag.org.

Chung, Sung-Wook; Ginger, David S.; Morales, Mark W.; Zhang, Zhengfan; Chandrasekhar, Venkat; Ratner, Mark A.; Mirkin, Chad A.; “Top-Down Meets Bottom-Up: Dip-Pen Nanolithography and DNA-Directed Assembly of Nanoscale Electrical Circuits”; Small; bearing dates of May 27, 2004, 2005; No. 1; pp. 2-7; Wiley-VCH Verlag GmbH & Co. KGaA; located at: www.small-journal.com.

“DNA self-assembly used to mass-produce patterned nanostructures”; Nanotechnology; Dec. 23, 2005; pp. 1-6; Physorg.com; located at http://www.physorg.com/news9322.html; printed on Feb. 16, 2006.

“Forming Photonic Crystal Patterns From Hydrogel Nanoparticles”; Spacedaily: Your Portal to Space; Sep. 11, 2003; pp. 1-5; located at: http://www.spacedaily.com/news/nanotech-03zs.html; printed on Mar. 9, 2005.

Freitas Jr., Robert A.; “The Future of Nanofabrication and Molecular Scale Devices in Nanomedicine”; Nanomedicine Book Chapter—MIT-OIS—2001; bearing dates of Jul. 2002, 2001; pp. 1-17; Zyvex Corp.; located at: http://www.rfreitas.com/Nano/FutureNanofabNMed.htm; printed on Mar. 9, 2005.

Goodman, R.P.; Schaap, I.A.T.; Tardin, C.F.; Erben, C.M.; Berry, R.M.; Schmidt, C.F.; Turberfield, A.J.; “Rapid Chiral Assembly of Rigid DNA Building Blocks for Molecular Nanofabrication”; Science; Bearing a date of Dec. 9, 2005; pp. 1661-1665; vol. 310; located at www.sciencemag.org.

Gracias, David H.; Tien, Joe; Breen, Tricia L.; Hsu, Carey; Whitesides, George M.; “Forming Electrical Networks in Three Dimensions by Self-Assembly”; Science; Aug. 18, 2000; vol. 289; pp. 1170-1172; located at: www.sciencemag.org.

Grzybowski, Bartosz A.; Bowden, Ned; Arias, Francisco; Yang, Hong; Whtesides, George M.; “Modeling of Menisci and Capillary Forces from the Millimeter to the Micrometer Size Range”; J. Phys.

(56) References Cited

OTHER PUBLICATIONS

Chem. B; bearing dates of Jul. 24, 2000, Oct. 25, 2000, Dec. 19, 2000, 2001; vol. 105; pp. 404-412; American Chemical Society.
Jakab, Karoly; Neagu, Adrian; Mironov, Vladimir; Markwald, Roger R.; Forgacs, Gabor; "Engineering biological structures of prescribed shape using self-assembling multicellular systems"; PNAS; bearing dates of Mar. 2, 2004, Jan. 8, 2004, 2004, Jul. 20, 2003; vol. 101, No. 9; pp. 2864-2869; located at: www.pnas.org/cgi/doi/10.1073/pnas.0400164101.
"LED Panels—Technical Details"; SuperSCREEN.com; pp. 1-2; located at http://www.superscreen.com/led/en/20mm_panel.php?navid=15; printed on Mar. 31, 2005.
Licata, Nicholas A.; Tkachenko, Alexei V.; "Error-proof programmable self-assembly of DNA-nanoparticle clusters"; pp. 1-5; located at http://xxx.lanl.gov/PS._cache/cond-mat/pdf/0504/0504407.pdf; bearing a date of Apr. 16, 2005; Department of Physics; University of Michigan; Ann Arbor; Michigan.
Montemagno, Carlo; Bachand, George; "Constructing nanomechanical devices powered by biomolecular motors"; Nanotechnology; bearing dates of Jan. 21, 1999, 1999; vol. 10; pp. 225-231;(+ duplicate Nanotech cover page and duplicate pp. 226, 228, 229, 230, for sake of clarity); IOP Publishing Ltd.
Redl, F.X.; Cho, K.-S.; Murray, C.B., O'Brien, S.; "Three-dimensional binary superlattices of magnetic nanocrystals and semiconductor quantum dots"; Nature; Jun. 26, 2003; bearing a date of 2003; vol. 423; pp. 968-971; Nature Publishing Group.
Segelken, Roger; "First Biomolecular Motors with Metal Propellers are Reported by Cornell Nanobiotechnologists"; NanoMeter; Spring 2001; vol. 12, No. 1; pp. 1-8; Cornell Nanofabrication Facility.
Srinivasan, Uthara; Liepmann, Dorian; Howe, Roger T.—Fellow, *IEEE;* "Microstructure to Substrate Self-Assembly Using Capillary Forces"; Journal of Microelectromechanical Systems; bearing dates of Jul. 21, 2000, Oct. 15, 2000, Mar. 2001; vol. 10, No. 1; pp. 17-24; IEEE.
Tien, Joe; Terfort, Andreas; Whitesides, George M.; "Microfabrication through Electrostatic Self-Assembly"; Langmuir; bearing dates of May 2, 1997, Jul. 29, 1997, 1997; vol. 13; pp. 5349-5355; American Chemical Society.
Whitesides, George M.; Grzybowski, Bartosz; "Self-Assembly at All Scales"; Science; Mar. 29, 2002; vol. 295; pp. 2418-2421; located at: www.sciencemag.org.
Xiong, Xiaorong; Hanein, Yael—Member, *IEEE;* Fang, Jiandong; Wang, Yanbing; Wang, Weihua; Schwartz, Daniel T.; Böhringer, Karl F.-Member, *IEEE;* "Controlled Multibatch Self-Assembly of Microdevices"; Journal of Microelectromechanical Systems; bearing dates of Apr. 2003, 2003; vol. 12, No. 2; pp. 117-127, Errata; IEEE.
Zheng, Wei; Buhlmann, Philippe; Jacobs, Heiko O.; "Sequential shape- and-solder-directed self-assembly of functional microsystems"; PNAS; bearing dates of Jul. 23, 2004, Jun. 21, 2004, Aug. 31, 2004; vol. 101, No. 35; pp. 12814-12817; The National Academy of Sciences of the USA; located at: www.pnas.org/cgi/doi/10.1073/pnas.0404437101.

| 808 | 810 | 804 | 806 | 808 | 810 |
|---|---|---|---|---|---|
| 804 | 806 | 808 | 810 | 804 | 806 |
| 808 | 810 | 804 | 806 | 808 | 810 |
| 804 | 806 | 808 | 810 | 804 | 806 |
| 808 | 810 | 804 | 806 | 808 | 810 |
| 804 | 806 | 808 | 810 | 804 | 806 |

800

802

1200

1202

Get Well Soon!

FIG. 27

SELF ASSEMBLY OF ELEMENTS FOR DISPLAYS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

- For purposes of the USPTO extra-statutory requirements, the present application constitutes a divisional of U.S. patent application Ser. No. 11/447,682, entitled SELF ASSEMBLY OF ELEMENTS FOR DISPLAYS, naming W. Daniel Hillis, Nathan P. Myhrvold, Clarence T. Tegreene, Lowell L. Wood, Jr., and Victoria Y. H. Wood as inventors, filed 5 Jun. 2006, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 12/590,779, entitled SELF ASSEMBLY OF ELEMENTS FOR DISPLAYS, naming W. Daniel Hillis, Nathan P. Myhrvold, Clarence T. Tegreene, Lowell L. Wood, Jr., and Victoria Y. H. Wood as inventors, filed substantially contemporaneously herewith, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/078,206, entitled SELF ASSEMBLY OF ELEMENTS FOR DISPLAYS, naming W. Daniel Hillis, Nathan P. Myhrvold, Clarence T. Tegreene, Lowell L. Wood, Jr., and Victoria Y. H. Wood as inventors, filed 11 Mar. 2005, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/447,611, entitled SELF ASSEMBLY OF ELEMENTS FOR DISPLAYS, naming W. Daniel Hillis, Nathan P. Myhrvold, Clarence T. Tegreene, Lowell L. Wood, Jr., and Victoria Y. H. Wood as inventors, filed 5 Jun. 2006, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/078,207, entitled ELEMENTS FOR SELF ASSEMBLING DISPLAYS, naming W. Daniel Hillis, Nathan P. Myhrvold, Clarence T. Tegreene, Lowell L. Wood, Jr., and Victoria Y. H. Wood as inventors, filed 11 Mar. 2005, which is currently co-pending, or is an application of which a currently co-pending application is entitled to the benefit of the filing date.

- For purposes of the USPTO extra-statutory requirements, the present application constitutes a continuation-in-part of U.S. patent application Ser. No. 12/215,644, entitled ELEMENTS FOR SELF ASSEMBLING DISPLAYS, naming W. Daniel Hillis, Nathan P. Myhrvold, Clarence T. Tegreene, Lowell L. Wood, Jr., and Victoria Y. H. Wood as inventors, filed 27 Jun. 2008, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/099,409, entitled SELF ASSEMBLING DISPLAY WITH SUBSTRATE, naming W. Daniel Hillis, Nathan P. Myhrvold, Clarence T. Tegreene, Lowell L. Wood, Jr., and Victoria Y. H. Wood as inventors, filed 4 Apr. 2005, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/497,793, entitled SELF ASSEMBLING DISPLAY WITH SUBSTRATE, naming W. Daniel Hillis, Nathan P. Myhrvold, Clarence T. Tegreene, Lowell L. Wood, Jr., and Victoria Y. H. Wood as inventors, filed 2 Aug. 2006, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/113,453, entitled SUPERIMPOSED DISPLAYS, naming W. Daniel Hillis, Nathan P. Myhrvold, Clarence T. Tegreene, and Lowell L. Wood, Jr. as inventors, filed 22 Apr. 2005, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/449,516, entitled SUPERIMPOSED DISPLAYS, naming W. Daniel Hillis, Nathan P. Myhrvold, Clarence T. Tegreene, and Lowell L. Wood, Jr. as inventors, filed 7 Jun. 2006, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 12/583,511, entitled SUPERIMPOSED DISPLAYS, naming W. Daniel Hillis, Nathan P. Myhrvold, Clarence T. Tegreene, and Lowell L. Wood, Jr. as inventors, filed 20 Aug. 2009, which is currently co-pending, or is an application of which a currently co-pending application is entitled to the benefit of the filing date.
- For purposes of the USPTO extra-statutory requirements, the present application constitutes a continuation-in-part of U.S. patent application Ser. No. 11/099,682, entitled METHOD OF ASSEMBLING DISPLAYS ON SUBSTRATES, naming W. Daniel Hillis, Nathan P. Myhrvold, Clarence T. Tegreene, Lowell L. Wood, Jr., and Victoria Y. H. Wood as inventors, filed 4 Apr. 2005, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/499,247, entitled METHOD OF ASSEMBLING DISPLAYS ON SUBSTRATES, naming W. Daniel Hillis, Nathan P. Myhrvold, Clarence T. Tegreene, Lowell L. Wood, Jr., and Victoria Y. H. Wood as inventors, filed 3 Aug. 2006, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, *Benefit of Prior-Filed Application*, USPTO Official Gazette Mar. 18, 2003, available at http://www.uspto.gov/web/offices/com/sol/og/2003/week11/patbene.htm. The present applicant entity has provided above a specific reference to the application(s) from which priority is being claimed as recited by statute. Applicant entity understands that the statute is unambiguous in its specific reference language and does not require either a serial number or any characterization, such as "continuation" or "continuation-in-part," for claiming priority to U.S. patent applications. Notwithstanding the foregoing, applicant entity understands that the USPTO's computer programs have certain data entry requirements, and hence applicant entity is designating the present application as a continuation-in-part of its parent applications as set forth above, but expressly points out that such designations are not to be construed in any way as any type of commentary and/or admission as to whether or not the present application contains any new matter in addition to the matter of its parent application(s).

TECHNICAL FIELD

The present application relates, in general, to the field of displays, and particularly to methods of manufacture thereof.

BACKGROUND

Displays used in television screens, computer monitors, electronic signs or displays, and the like may be formed from arrays of large numbers of light emitting elements that may be controlled to display time-varying patterns of light. Color displays typically include light emitting elements that emit light of several colors. Displays commonly include elements capable of emitting red, green, or blue wavelengths (corresponding to the color sensitivities of the photoreceptors in the human eye), since by adjusting the intensity of the three colors appropriately, any color in the visible spectrum can be represented to the human eye.

SUMMARY

Embodiments of methods and systems for self-organization and assembly of display elements to form displays are disclosed herein. Features of various embodiments will be apparent from the following detailed description and associated drawings.

BRIEF DESCRIPTION OF THE FIGURES

Features of the invention are set forth in the appended claims. The exemplary embodiments may best be understood by making reference to the following description taken in conjunction with the accompanying drawings. In the figures, like referenced numerals identify like elements.

FIG. 11 illustrates connection of display elements to other display elements and to a substrate;

FIG. 27 depicts an embodiment used in a decorative object;

DETAILED DESCRIPTION

In the following detailed description, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims.

Throughout the specification and claims, the following terms take the meanings explicitly associated herein unless the context dictates otherwise. The meaning of "a", "an", and "the" include plural references. The meaning of "in" includes "in" and "on." A reference to the singular includes a reference to the plural unless otherwise stated or inconsistent with the disclosure herein.

Figure 1A:
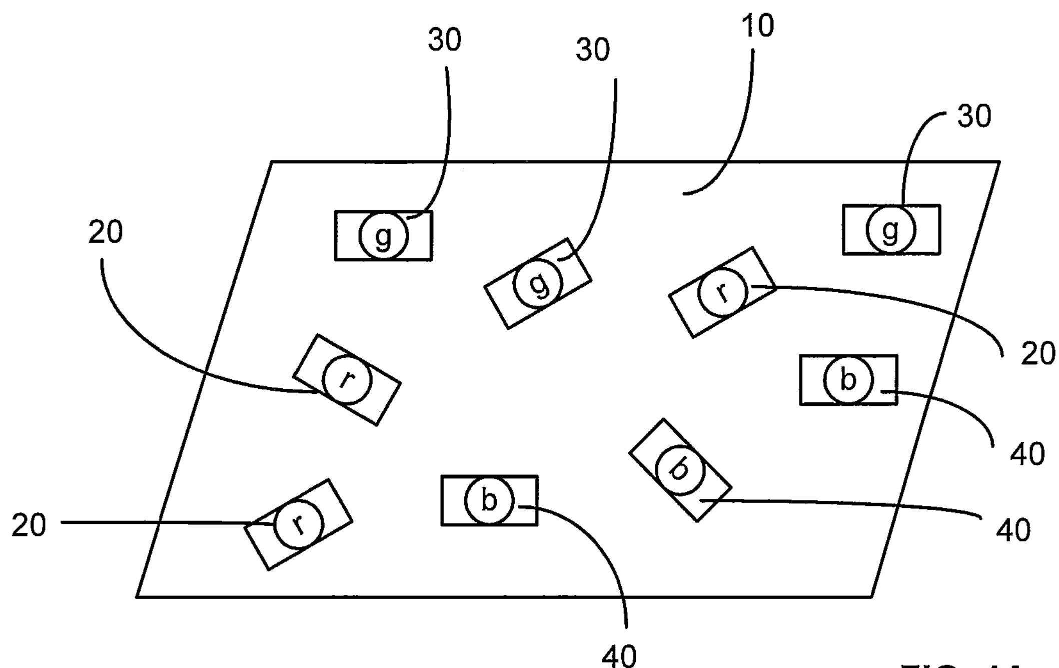
FIG. 1A illustrates a plurality of a display elements disposed on a substrate.
Figure 1B:
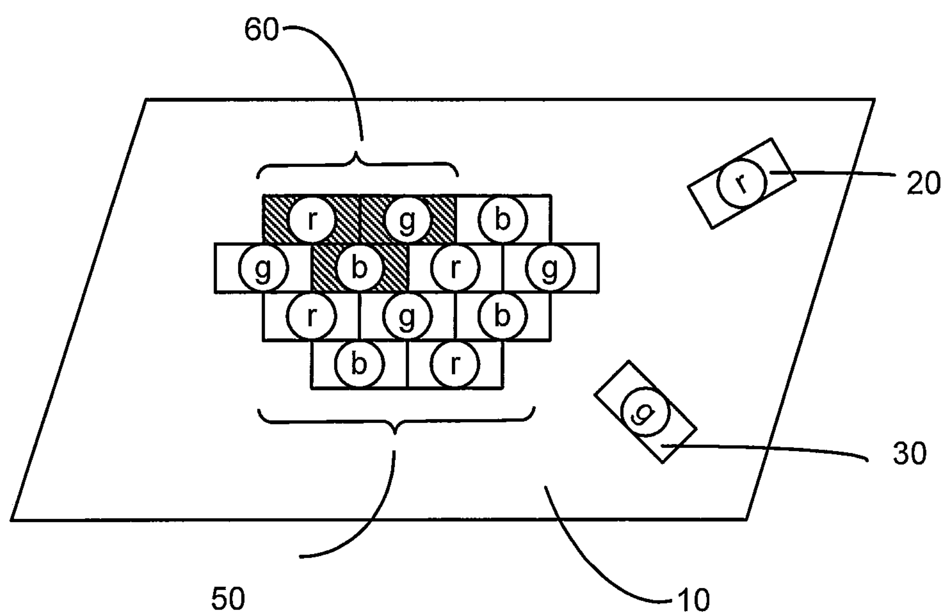
FIG. 1B illustrates display elements in a self-organized array on a substrate.
Figure 2:
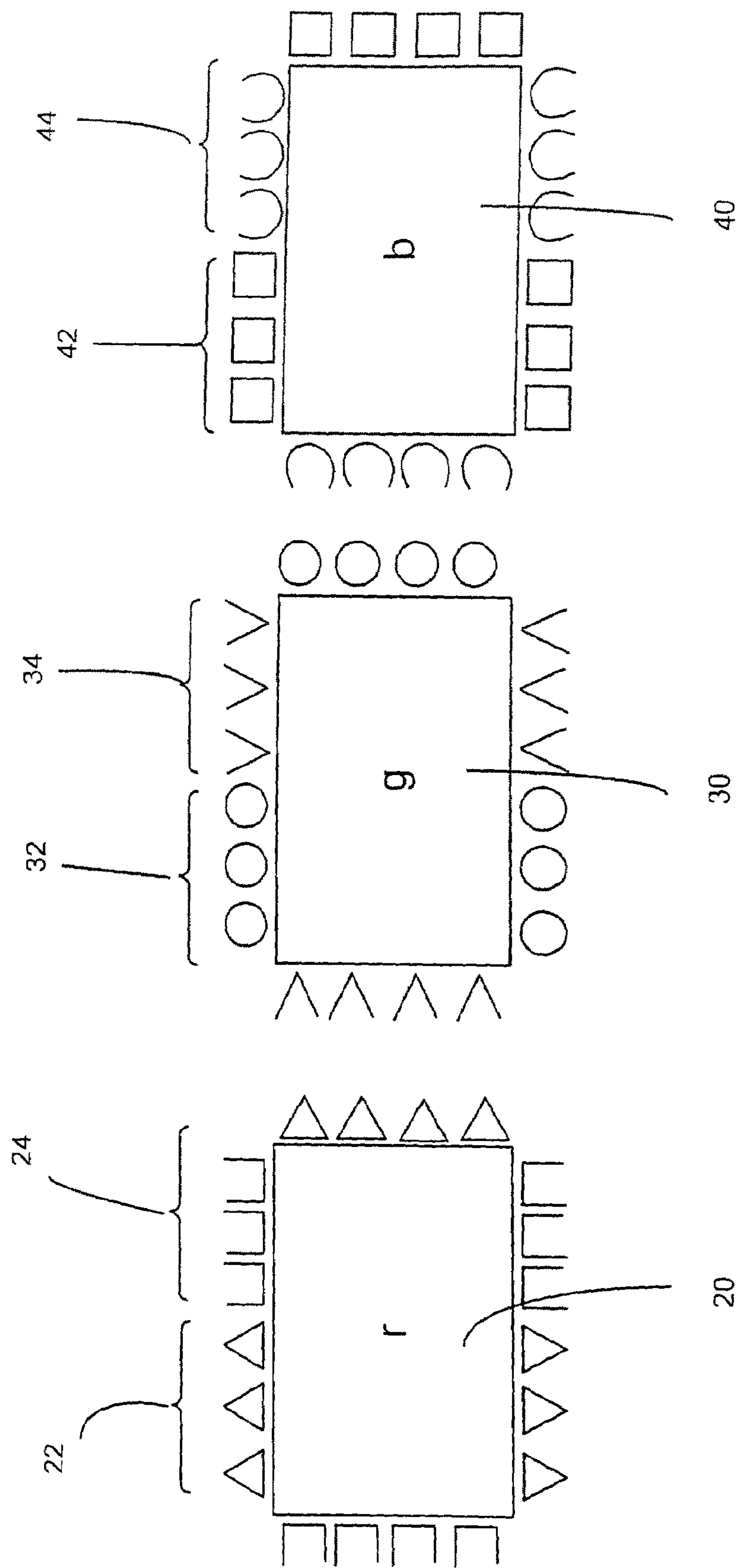
FIG. 2 illustrates display elements having complementary surface characteristics.
Figure 3:
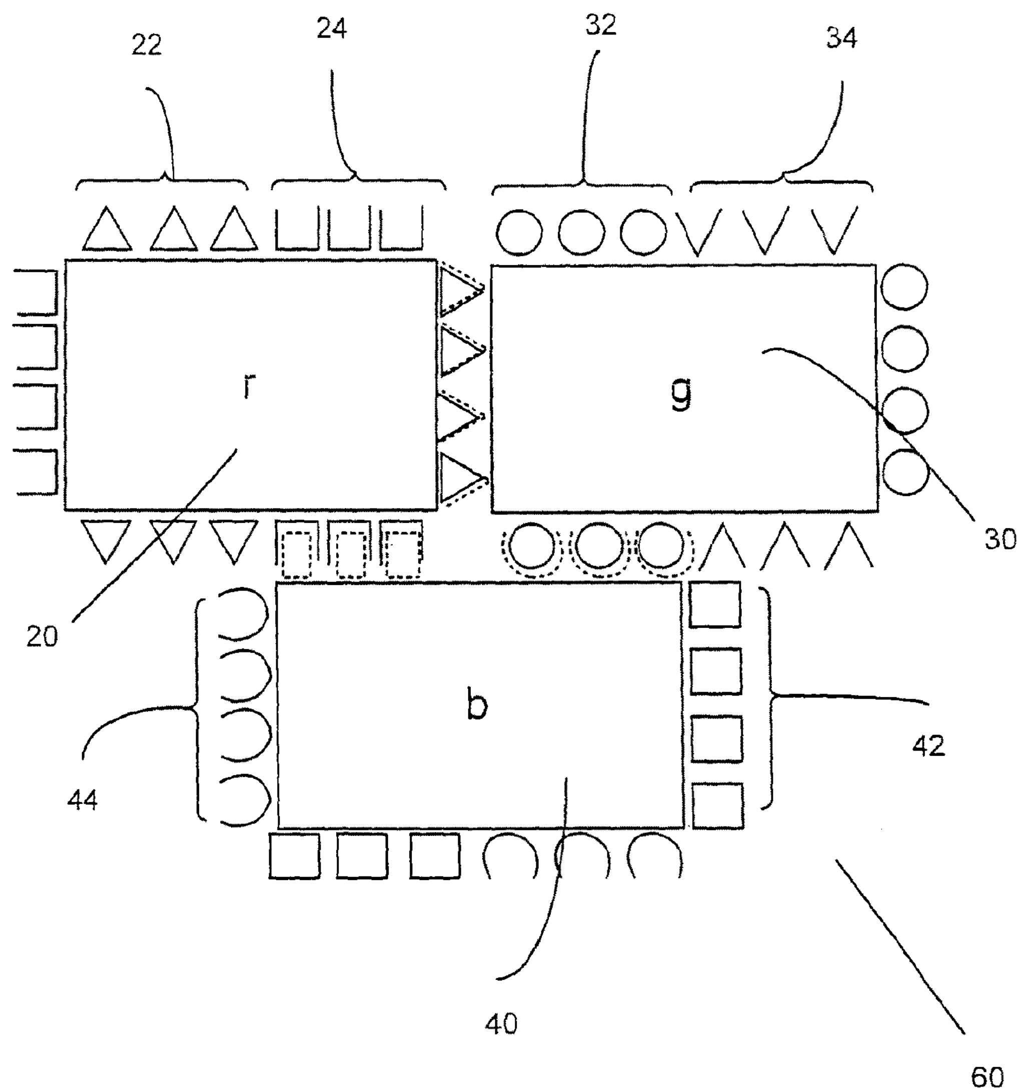
FIG. 3 illustrates a triad formed from the display elements of FIG. 2.

FIGS. 1-3 illustrate the manufacture of a three-color display according to one exemplary embodiment. According to this embodiment, three different types of display elements, each type capable of emitting light of a respective one of three colors, self-organize to form an array of display elements. Self-organized display elements are assembled to form a display made up of display elements that may be individually controlled by suitable control signals to generate desired patterns of light. FIG. 1A illustrates multiple display elements of three different types 20, 30, and 40, disposed on substrate 10. In this exemplary embodiment, first display element type 20 emits light in a red wavelength band, second display element type 30 emits light in a green wavelength band, and third display element type 40 emits light in a blue wavelength band.

While red, green, and blue light emitting elements assembled as a triad are presented in this exemplary embodiment, other combinations of colors, other numbers of elements, and other light controlling types of elements, such as light absorbing, reflecting, or filtering structures (e.g., LCD elements), may be appropriate in some configurations. Moreover, as described below, such assemblies are not limited to single elements of each type or one-to-one correspondence of elements of each type.

FIG. 1B depicts a self-organized array 50 of display elements 20, 30, and 40, formed on substrate 10. Self-organized array 50 is formed by virtue of display elements 20, 30 and 40 having surface, shape, or other characteristics that predispose the display elements to self-organize into preferred arrangements with respect to other display elements. Self-organized array 50 includes multiple triads 60 (one of which is indicated by the shaded display elements in FIG. 1B). Each triad 60 includes a single display element of first display element type 20, a single display element of second display element type 30, and a single display element of third display element type 40. Thus, each triad 60 includes one display element capable of emitting light in a red wavelength band, one display element capable of emitting light in a green wavelength band, and one display element capable of emitting light in a blue wavelength band. Self-organized array 50 may be made up of multiple complete triads 60 as well as individual display elements 20, 30 and 40 that are not members of complete triads. In this example, self-organized array 50 is characterized by a repeating pattern that has both short and long range order. A relatively small self-organized array 50 is depicted for purposes of illustration, but in many applications, larger arrays in which the triad pattern is repeated a large number of times may be used. For example, displays for use as computer or television screens may include arrays of display elements made up of thousands or millions of display elements. Each of display element types 20, 30, and 40 is configured to form preferred associations with the other display element types, such that the display elements self-organize into a pattern that may have both short or long-range order.

FIG. 2 illustrates, in simplified form, how display element types 20, 30, and 40 are configured to promote the formation of preferred associations between different display element types. In this example, each display element includes surface regions having characteristics or properties that cause it to associate preferentially with the other two types of display elements in a well-defined manner. First surface property 22 on first display element type 20 interacts with first complementary surface property 34 on second display element type 30, second surface property 32 on second display element type 30 interacts with second complementary surface property 44 on third display element type 40, and third surface property 42 on third display element type 40 interacts with third complementary surface property 24 on first display element type 20. First surface property 22, second surface property 32, and third surface property 42 are depicted as triangles, circles, and rectangles, while first complementary surface property 34, second complementary surface property 44, and third complementary surface property 24 are depicted as open structures capable of fitting about a triangle, a circle, and a rectangle, respectively. These shapes generically represent how different display element surface regions may have different characteristics to promote self-organization of display elements into preferred arrangements, and are not intended to be limiting with respect to specific types of surface properties.

Properties or characteristics that may promote selective association or interaction of surface regions may include macro and microscale shape and surface properties. Shape characteristics such as concavities, convexities, or various combinations thereof may be used to promote self assembly, as described in U.S. Pat. No. 6,507,989; Srinivasan et al., J. Microelectromechanical Systems, Vol. 10, No. 1, pp. 17-24, March 2001; Zheng et al.; Proc. Natl. Acad. Sci., Vol 101, No. 35, pp. 12814-12817, Aug. 31, 2004; and Whitesides and Grzybowski, Science Vol. 295, pp. 2418-2421, Mar. 29, 2002; all of which are incorporated herein by reference. Surface characteristics that promote self assembly include but are not limited to charge or surface energy properties, magnetic properties, or binding affinities, as discussed in Bowden et al., J. Am. Chem. Soc., Vol. 121, pp. 5373-5391, 1999 and Srinivasan et al., J. Microelectromechanical Systems, Vol. 10, No. 1, pp. 17-24, March 2001; both of which are incorporated herein by reference. Such properties may be conferred on a surface by molecules bound or otherwise adhered or applied to the surface. Properties that have an effect at the surface may also be internal properties of a display element; e.g., a surface magnetic field may be produced by magnetized structures within a display element. Molecular structures may promote association or interactions including charge interactions, hydrogen bonding, molecular bonding, or other molecular interactions. The surface may, for example, be coated with biomolecules having specific binding affinities. Selective interactions of biomolecules to other biomolecules or to non-biological molecules including, but not limited to, base pairing of complementary nucleic acid sequences, amino acid and/or protein-protein interactions, or antibody-antigen interactions, may be employed in some embodiments, as described in Montemagno and Bachard; Nanotechnology, Vol. 10, pp. 225-231, 1999; Chung et al., Small, Vol. 1, pp. 1-5, 2005; and Jakab et al., Proc. Natl. Acad. Sci. Vol 101, No. 9, pp. 2865-2869, Mar. 2, 2004, all of which are incorporated herein by reference. For the purpose of promoting self-organization, interactions or associations between display elements may range from relatively weak to relatively strong interactions or associations. Individual display elements may have both distinctive shape and surface properties selected to promote the formation of preferred associations with one or more other types of display elements with a degree of preference that depends upon the type of display element.

According to one preferred embodiment, display elements may have a characteristic shape or surface property and include a light emitting element capable of emitting light of a characteristic wavelength band. The characteristic shape or surface property is adapted to cause each display element to form preferred associations with one or more other types of display elements with a degree of preference that depends upon the type of display element. In certain embodiments, display elements have one or more characteristic shape or surface properties that are selected to provide a relatively lower preference for forming associations with other display elements of the same type than for forming associations with other display elements of different types.

FIG. 3 depicts display elements of types 20, 30, and 40 that have interacted to form a triad 60. In this example, each of the three display element types interacts preferentially with the two other display element types. For each display element within triad 60, surface regions having a particular surface property have interacted with surface regions having complementary surface properties on other display elements, causing the display elements to form specific associations with display elements of the other two types. This is represented, for example, by the pairing of circles symbolizing second surface property 32 with open circles symbolizing second complementary surface property 44. Individual triads or repeating patterns made up of complete or partial triads represent preferred arrangements or patterns of display elements types 20, 30, and 40. As depicted in FIG. 1A, display elements may be disposed on a substrate, following which they self-organize or self assemble into a preferred arrangement, as determined by their respective surface or shape characteristics. In some embodiments, movement of display elements into preferred arrangements is energetically favored. In some cases, surface or shape characteristics may produce sufficiently strong attractions between display elements that they self-assemble into a preferred arrangement on the substrate without further input of energy. In many cases, however, input of energy (e.g., an activation energy) may be required to cause display elements to move into their preferred arrangement. Energy may be input to the display elements by imparting relative motion between display elements and substrate, e.g. by shaking or vibrating the substrate. Display elements may then move with respect to each other until they eventually form preferred associations within the group of display elements disposed on the substrate. Other forms of activation energy (e.g., light, heat, chemical energy) may also be used to promote formation of preferred associations. One or more activation energies may be applied independently or a plurality of forms of activation energies may be applied in combination.

Figure 4:
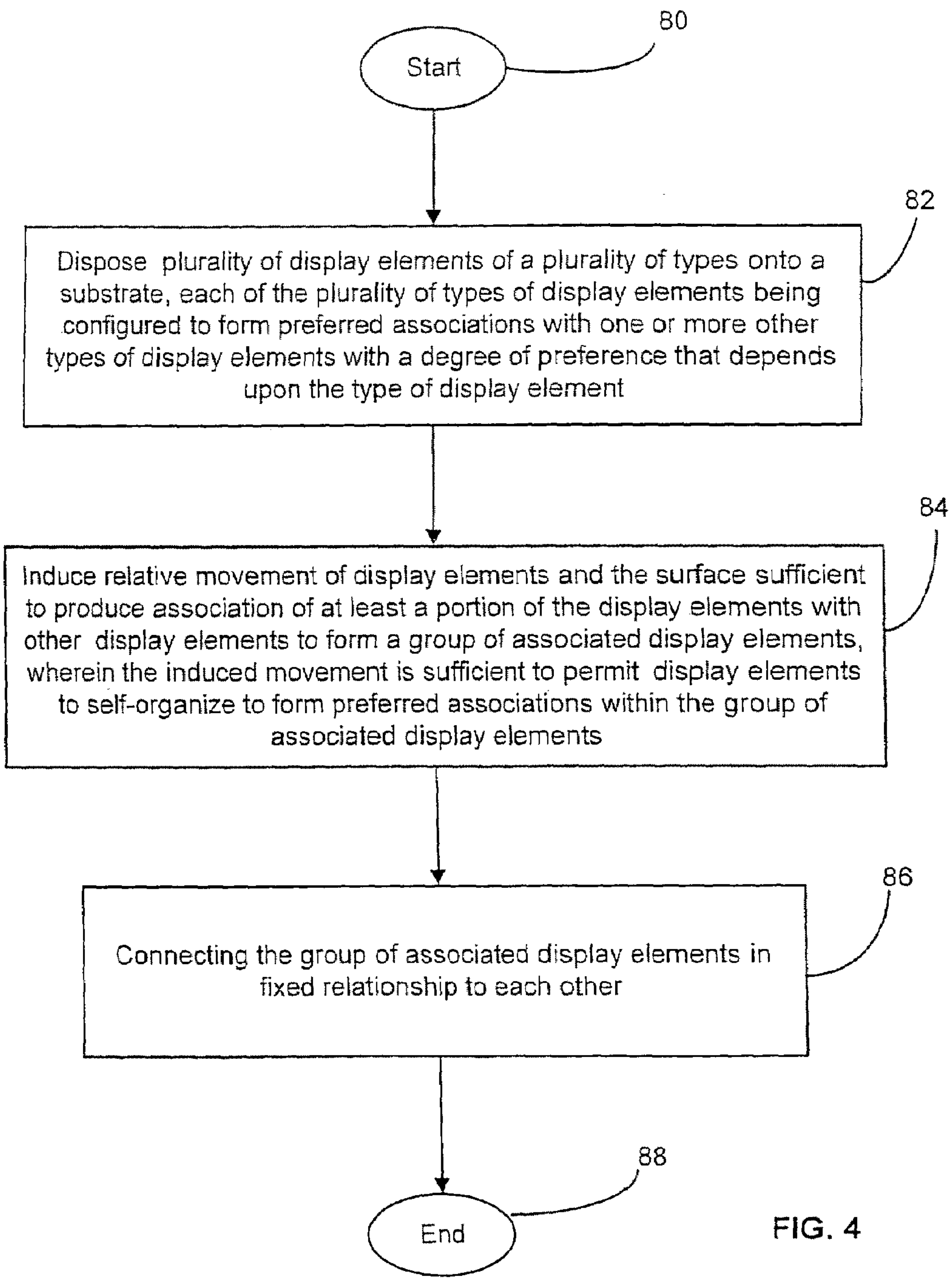
FIG. 4 is a flow diagram of a method of manufacturing a display.

As depicted in FIG. 4, an exemplary method of forming a display according to certain embodiments includes disposing a plurality of display elements of a plurality of types onto a substrate at step 82, inducing relative movement of the display elements and the surface sufficient to produce association of at least a portion of the display elements with other display elements to form a group of associated display elements at step 84, and connecting the group of associated display elements in fixed relationship to each other at step 86. Each of the plurality of types of display elements may be configured to form preferred associations with one or more other types of display elements, with the degree of preference dependent on the type of the display element. The relative movement induced between the display elements and the surface may be sufficient to permit the display elements to self-organize to form preferred associations within the group of associated display elements.

Figure 5:
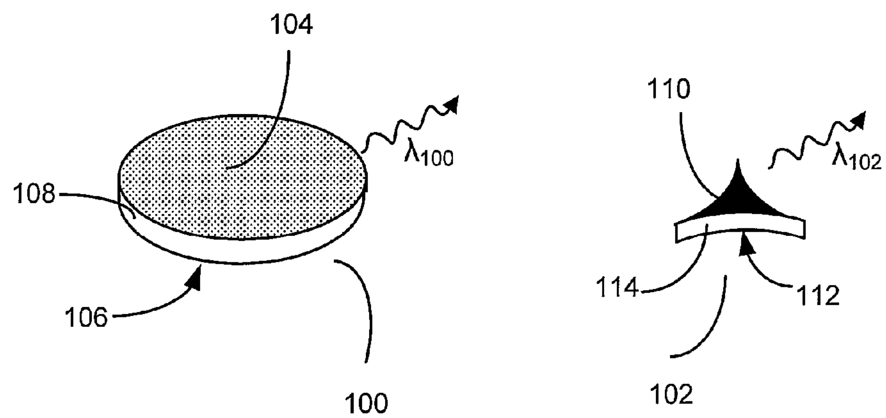
FIG. 5 depicts display elements having different shape characteristics.
Figure 6:
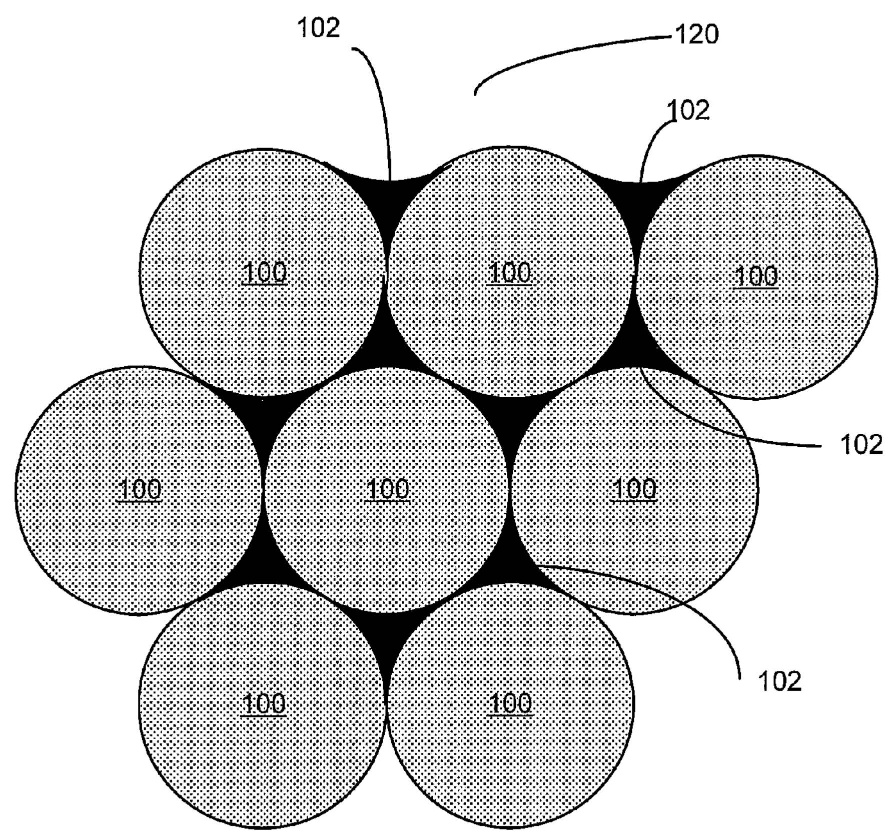
FIG. 6 illustrates a self-organized array of the display elements of FIG. 4.

FIGS. 5 and 6 illustrate how display elements having different shape characteristics may be used in the construction of self-organizing arrays. Two display element types 100 and 102 are depicted in FIG. 5. Convex display element 100 has a flattened cylindrical shape with two round, parallel, opposing faces 104 and 106 and generally convex sides 108. Convex display element 100 emits light having wavelength band $\lambda_{100}$. Concave display element 102 is a generally flattened shape having two parallel opposing faces 110 and 112. Concave display element 102 may be of substantially the same thickness as convex display element 100. Opposing faces 110 and 112 are roughly triangular in shape. Concave display element 102 has three generally concave sides 114 having curvatures adapted to fit against convex side 108 of display element type 100. Concave display element 102 emits light having wavelength band $\lambda_{102}$.

FIG. 6 illustrates an array 120 formed by multiple display elements 100 and 102. It can be seen that each convex display element 100 has six neighboring concave display elements 102, while each concave display element 102 has three neighboring convex display elements 100. If the array pattern is extended, the overall ratio of display elements of type 102 to display elements of type 100 in the array pattern is 2:1.

Figure 7:
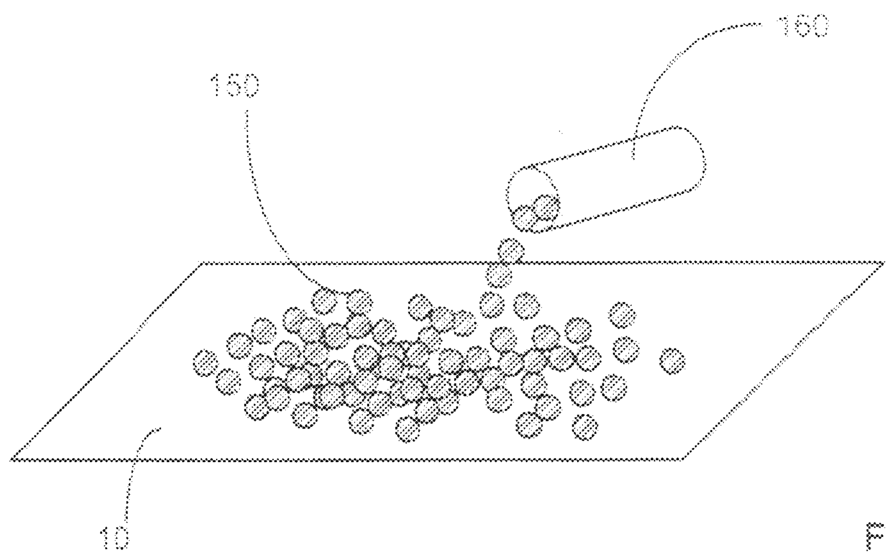
FIG. 7 shows distribution of display elements onto a substrate.

FIG. 7 illustrates a method of disposing display elements 150 onto a substrate 10. In the embodiment of FIG. 6, display elements 150 are poured onto substrate 10 from dispenser 160. Note that in the various subsequently described embodiments, reference number 150 applies to display elements in general, which may be of two, three, or more different types. As used herein, 'pouring' refers to a process by which multiple display elements are moved onto substrate 10 from a container or dispenser by means of gravity. Display elements poured onto substrate 10 may spread out into a single layer on substrate 10. Spreading of display elements onto substrate 10 may be facilitated, for example, by shaking or vibration of substrate 10. If display elements 150 are small enough and have suitable shape and surface characteristics, their behavior may be powder- or fluid-like. In order to facilitate the distribution of display elements onto substrate 10, display elements may be mixed into a liquid and applied to substrate 10 as a slurry, emulsion, suspension, colloid, or gel. Movement of display elements 150 on substrate 10 may also be facilitated by various mechanical spreaders, stirrers, etc., instead of or in addition to shaking, vibration, or other methods of imparting energy to the display elements and/or substrate.

Figure 8:
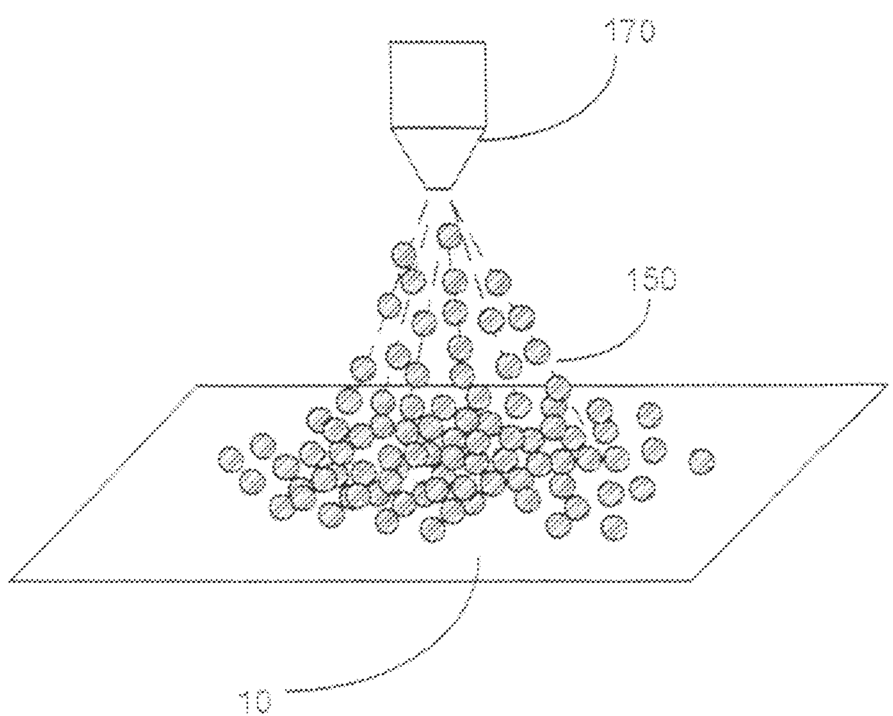
FIG. 8 shows an alternative method of distribution of display elements onto a substrate.

FIG. 8 illustrates another method of disposing display elements 150 onto substrate 10 by spraying. Display elements are ejected from a spray nozzle 170 under pressure. Spray nozzle 170 may be configured to disperse display elements 150 over substrate 10. As described in connection with the embodiment of FIG. 7, display elements may be mixed into a liquid, fluidized by the addition of a gas, or may be deposited without such mixing, for example, in a manner analogous to an hour glass.

In order to promote self-organization of display elements, relative movement of the multiple display elements and the substrate is induced. Such movement may be imparted, for example, by shaking or vibration of the substrate. Inducing relative movement of the display elements and surface may be sufficient to produce association of at least a portion of the display elements with other display elements to form a group of associated display elements. The induced movement may be sufficient to permit the display elements to self-organize to form preferred associations within the group of associated display elements. The movement may cause the display elements to distribute into a single layer on the substrate. In some embodiments, the induced movement is preferably sufficient to permit display elements to self-organize into preferred associations.

Relative movement of the display elements and the surface may be induced by shaking or vibrating the surface, or by otherwise moving the surface. The induced movement may be random or substantially random. The movement must be sufficient to move display elements relative to other display elements in order to cause display elements to come into proximity and have opportunity for interaction and/or association with display elements of various types. The pattern of shaking or vibration may be modified over time; e.g., more vigorous movement may be used to cause display elements to form a single layer, while movement that is gentler (or of a different frequency, direction, etc.) may be more effective for promoting associations of display elements within a single layer. Depending on the size and type of display elements and substrate, various methods of imparting motion and/or interaction between display elements and substrate may be used, and the embodiments depicted herein are only examples.

Figure 9A:
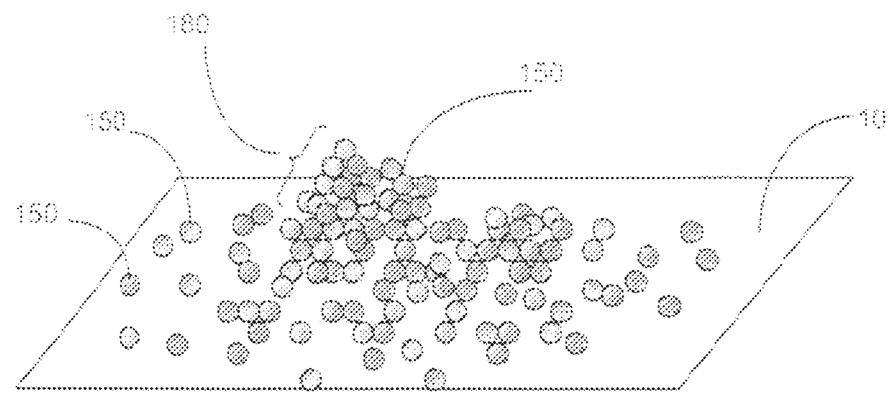
FIGS. 9A-9C depict self-organization of a display element array.
Figure 9B:
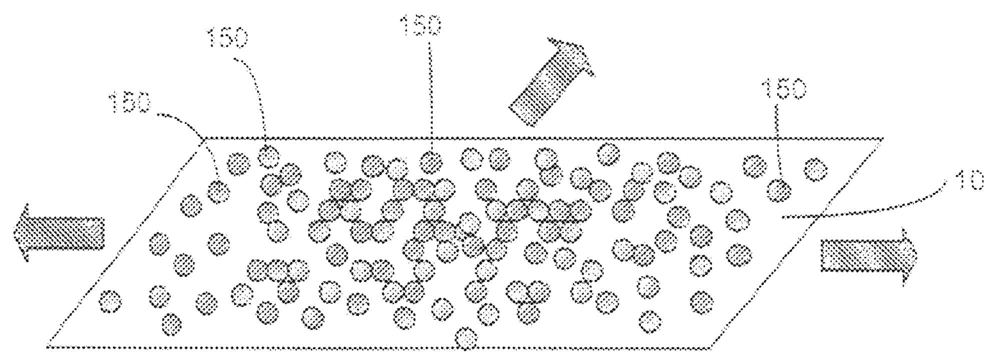
Figure 9C:
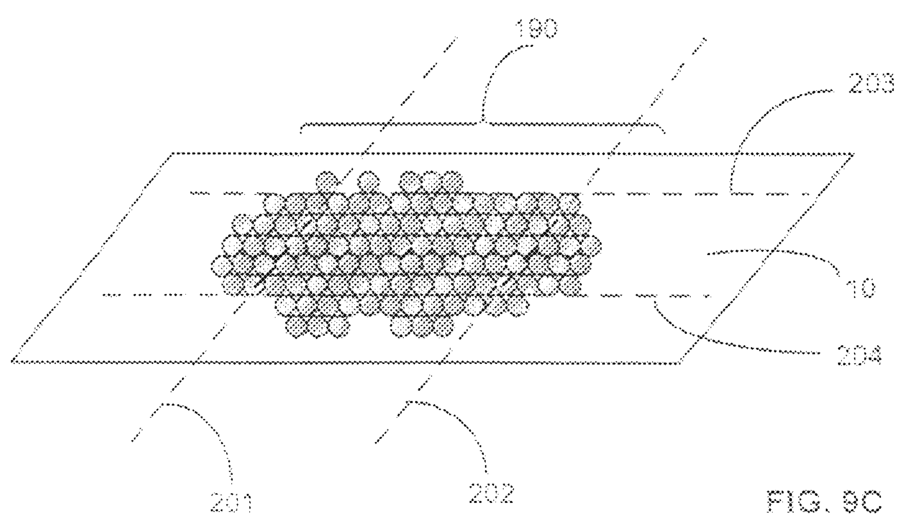

As shown in FIG. 9A, display elements 150 disposed on substrate 10 by pouring or spraying, (as described in connection with FIGS. 7 and 8, or by other methods), may not be distributed over substrate 10 in a single layer; in some regions (e.g., region 180 in FIG. 9A) display elements may be piled on other display elements in two or more layers. In many cases it is preferred that display elements distribute into a single layer on substrate 10. Distribution of display elements into a single layer may be aided by gravity as well as by induced movement between display elements and surface. In certain embodiments, distribution of display elements into a single layer may be aided by repulsion of one or more surfaces of the display element from the substrate surface. Such repulsion may take place, for example, because of surface energy effects, surface magnetic properties and the like due to suitable treatment of display elements and substrate surfaces. At the step depicted in FIG. 9B, shaking or vibrating substrate 10 may cause display elements to disperse further to form a single layer of display elements on substrate 10. Further shaking or vibration may be applied to cause display elements 150, now distributed in a single layer on substrate 10, to move into preferred associations or groupings to form a self-organized display element array 190 as shown in FIG. 9C. Self organized display element array 190 may have an irregular shape; in order to form a display having a desired shape and size, display element array 190 may be cut or otherwise subdivided, e.g., along lines 201, 202, 203 and 204, to obtain a finished display element array of the desired configuration.

Figure 10A:
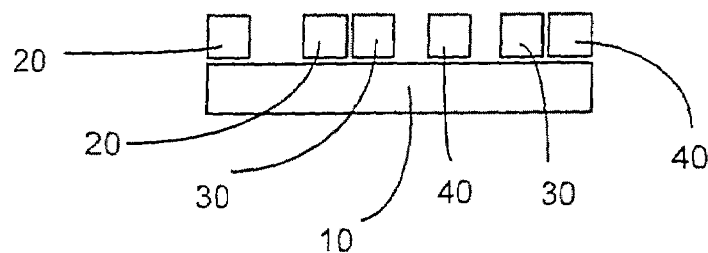
FIGS. 10A-10C illustrate the manufacture of an embodiment of a display.
Figure 10B:
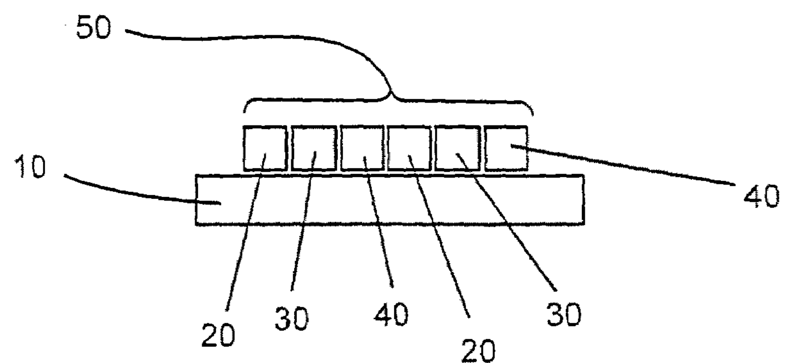
Figure 10C:
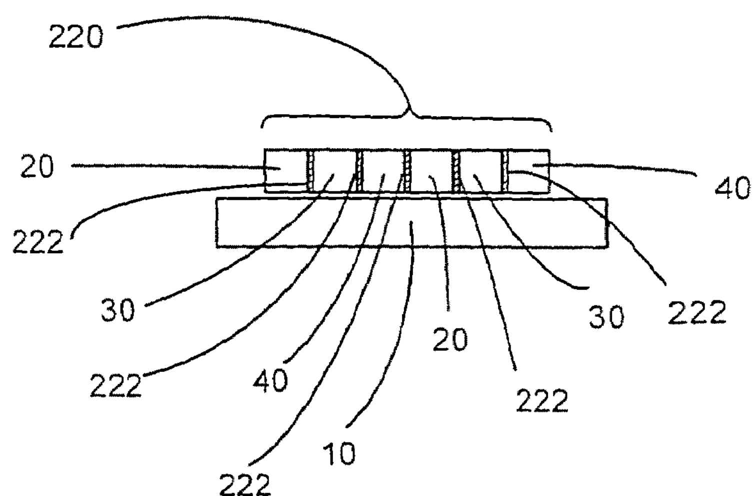

FIGS. 10A through 10C illustrate, in cross-sectional view, a process for constructing an embodiment of a self-organized display element array. Although three types of display elements (indicated by reference numbers 20, 30, and 40, discussed previously in connection with FIGS. 1-3) are depicted in FIGS. 10A-10C, the illustrated process is suitable for constructing self-assembling arrays made up of larger or smaller numbers of types of display elements, and is not limited to any particular type or number of display elements. In FIG. 10A, a plurality of display elements 20, 30, and 40 are disposed on a first substrate 10. As described previously, motion is induced in display elements 20, 30 and 40 relative to first substrate 10, causing the display elements 10, 30, and 40 to move into a self-organized display element array 50, as shown in FIG. 10B. In FIG. 10C, display elements 20, 30 and 40 are connected together to form connected display element array 220. Connections 222 between display elements may provide mechanical connections between display elements.

Display elements may be held in fixed relationship to each other in order to maintain a desired spacing between light emitting elements. In some cases, the interaction between display elements that is used to produce self-organization of display elements may be sufficiently strong that display elements will be joined securely without any further connection being provided between the display elements. In many cases, however, the association of display elements may not provide sufficiently secure connection of the display elements for the intended application. In such cases, associated display elements may be connected together by various methods. Display elements may be held in fixed spatial relationship with respect to other display elements by direct connections between adjacent display elements, or by connection of display elements to a substrate. Connections between display elements may provide structural or mechanical stability or rigidity. They may also provide electrical, optical, or other connections that provide for the transfer of data, power, or control signals between display elements and other display elements and/or a substrate. Connections between display elements may conduct thermal energy, thus providing a desired thermal environment, e.g. through providing a heat sink, cooling, or heating. Control and power signals may be transmitted to display elements by various means, including wireless transmissions, and assembly of display elements into arrays may be a separate process from the formation of control links to display elements.

Connections between display elements may be rigid or flexible. In some embodiments, a display element array formed of assembled and connected display elements may have sufficient structural integrity to be used without a supporting substrate. Display element arrays for use in television screens or computer monitors may be formed on rigid and substantially planar substrates, or be sufficiently rigid to be self-supporting. However, in some applications of display element arrays, it may be desirable for display element arrays to be formed on flexible substrates, or be self-supporting and flexible. Display element arrays formed on non-planar rigid or semi-rigid substrates may be used in other embodiments.

In some embodiments mechanical connections between display elements may serve only or primarily to maintain display elements in appropriate spatial relationship to other display elements, and may not lend significant strength to the display element array as a whole. In some embodiments mechanical connections may provide strength and structural integrity to the assembled array as a whole. Mechanical connections may be formed through the use of various adhesives, including self-fusing adhesives, similar to or including self-fusing silicone adhesives, an example of which is found in 3M® Scotch™ Self-Fusing Silicone Rubber Electrical Tape. They may also be formed by causing the material of the display elements themselves to fuse or adhere together. Such fusing or adhesion could be produced by applying heat, chemical treatment, pressure (for example, either steady or intermittent pressure, or ultrasonic pulses) to form connections between display elements. Such connections may be based on melting or sintering of display element materials, chemical bonding, cross linking, and various other processes, as known to those of skill in the relevant arts, exemplified by Gracius et al., Science, Vo. 280, pp. 1170-1172, Aug. 18, 2000 and Zheng et al.; Proc. Natl. Acad. Sci., Vol 101, No. 35, pp. 12814-12817, Aug. 31, 2004, both of which are incorporated herein by reference.

In some embodiments, connections between display elements may include one or more electrical connections between display elements. Electrical connections may permit the transmittal of control, data, and/or power signals. In some embodiments, connections between display elements may include one or more optical connections between display elements for the transmittal of control or data signals. Mechanical connections between display elements may be formed by adhesives of various types, depending on the material(s) used in the display elements. Electrical or optical connections may require the alignment of contact regions (which may occur simultaneously with self-organization of display elements) and formation of an electrical or optical connection, by suitable processes as listed above or other processes as will be known to those of skill in the relevant arts, such as conductive epoxies, mating metal surfaces or solder reflow.

Figure 11:
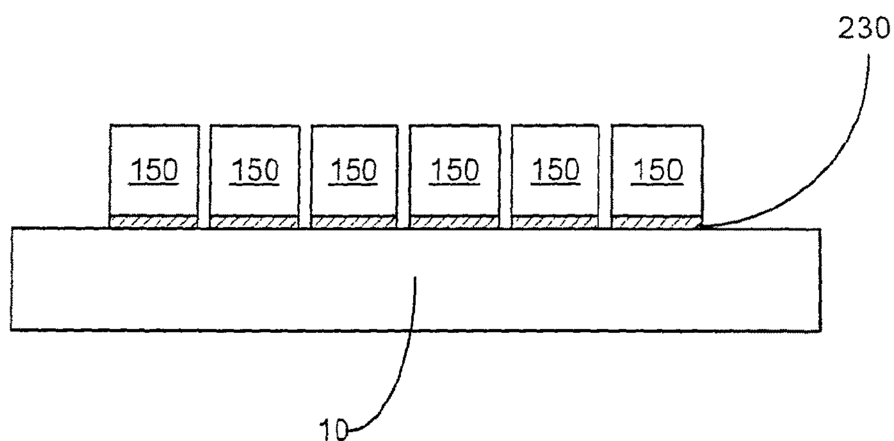
FIG. 11 illustrates connection of display elements to a substrate.
Figure 12:
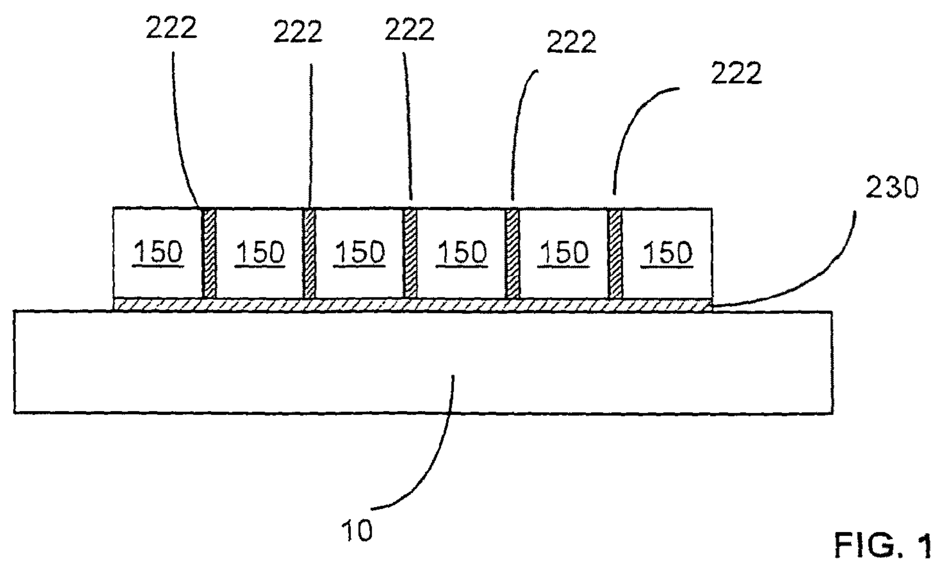

FIGS. 11 and 12 illustrate several alternative methods for maintaining display elements in appropriate relationship to each other. In the embodiment shown in FIG. 11, display elements 150 may be connected to substrate 10 by connection 230, but not connected to other display elements 150. In another exemplary embodiment, as shown in FIG. 12, display elements may be connected to adjacent display elements 150 by connections 222 as well as to substrate 10 by connection 230. Connections 222 between display elements 150, and connection 230 between display elements 150 and substrate 10 may provide only a mechanical connection between elements. In some embodiments the mechanical connection may serve only or primarily to maintain display elements in appropriate spatial relationship to other display elements, but not lend significant strength to the display element array as a whole. In some embodiments, substrate 10 may provide strength and structural integrity to the assembled array. In some embodiments, connection 230 may include one or more electrical connections between display elements 150 and substrate 10. Electrical connections may permit the transmittal of control, data, and/or power signals. In some embodiments, connection 230 may include one or more optical connections between display elements 150 and substrate 10, for the transmittal of control or data signals. Connection 230 may provide for the transfer of thermal energy between display elements 150 and substrate 10, which may provide a desired thermal environment, e.g. through providing a heat sink, cooling, or heating.

Mechanical connections between adjacent display elements and between display elements and substrate may be formed by adhesives of various types, depending on the material(s) used in the display elements. Mechanical connections may also be formed by causing the material of the display elements themselves to bond or adhere together. Such bonding or adhesion could be produced by applying heat, chemical treatment, pressure (for example, either steady or intermittent pressure, or ultrasonic pulses) to form connections between display elements. Such connections may be based on melting or sintering of display element materials, chemical bonding, cross linking, and various other processes, as known to those of skill in the relevant arts. Electrical or optical connections may require the alignment of contact regions (which may occur simultaneously with self-organization of display elements) and formation of an electrical or optical connection, by suitable processes as listed above or other processes known to those of skill in the relevant arts.

Groups of associated display elements may be connected to the substrate on which they were initially formed into an array, as described above, and illustrated in FIGS. 11 and 12. Display elements may be connected to the substrate either before, at the same time as, or after they are connected to other display elements. Alternatively, connected groups of display elements may rest upon and be supported by a substrate without being connected to the substrate, as illustrated in FIG. 10C. In some embodiments, connected groups of associated display elements may be removed from a substrate as a unit, and transferred to a different (destination) substrate. Connected groups of associated display elements transferred to a destination substrate may be connected to the destination substrate or simply rest upon and be supported by the destination substrate. In some applications, this may allow the original substrate to be optimized for self assembly, re-used and/or otherwise treated independently of the supporting destination substrate.

Figure 13A:
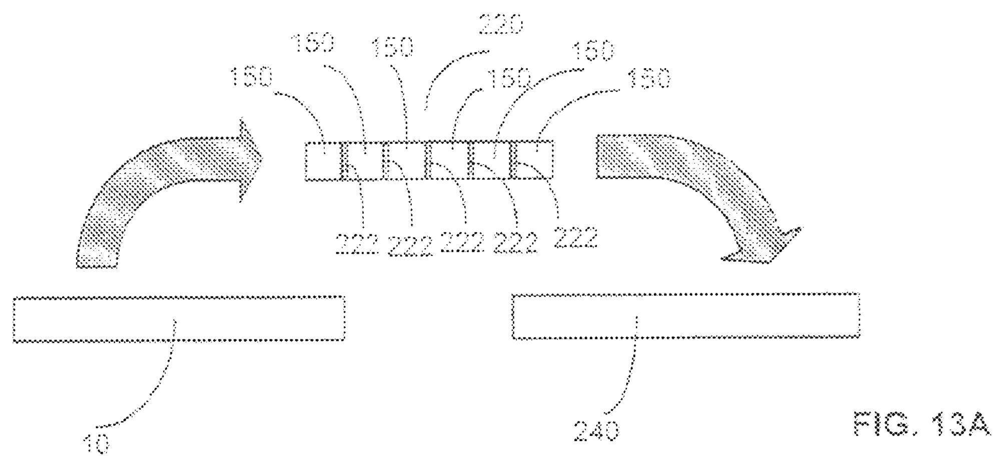
FIGS. 13A-13*c* illustrate transfer of connected display elements from one substrate to another.
Figure 13B:
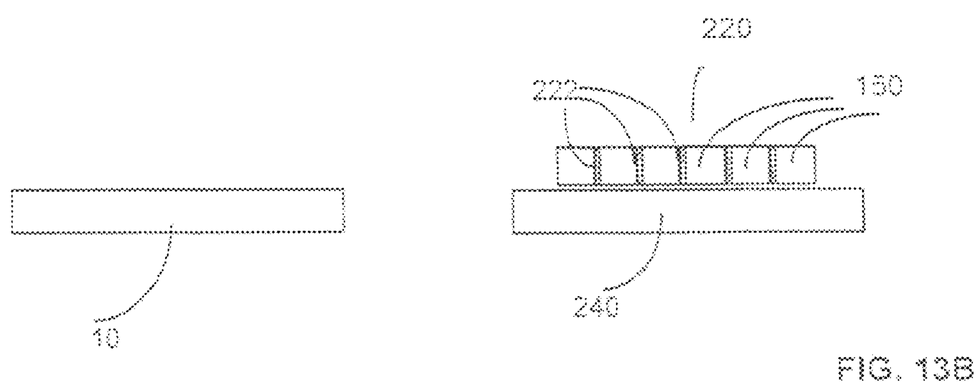

In FIG. 13A, connected display element array 220 is lifted from first substrate 10, and transferred to destination substrate 240. Connected display element array 220 may be transferred by various methods, the selection of which will depend on the size and stability of connected display element array 220. In FIG. 13B, connected display element array 220 rests on and is supported by substrate 240. Depending on the size and rigidity of the connected display element array, it may be lifted and dropped from one substrate and transferred to another (as depicted in FIGS. 13A and 13B) by various methods, either by lifting from below or above. Lifting from above may be accomplished by adhering the display element array temporarily to a lifting structure by various means, e.g. a vacuum, static electrical force, magnetic force, surface tension, a releasable adhesive, etc. The connected display element array may be lifted from below by a 'spatula' or 'forklift' type mechanism. As a further alternative, the connected display element array may be slid off of one substrate and onto the other.

Figure 13C:
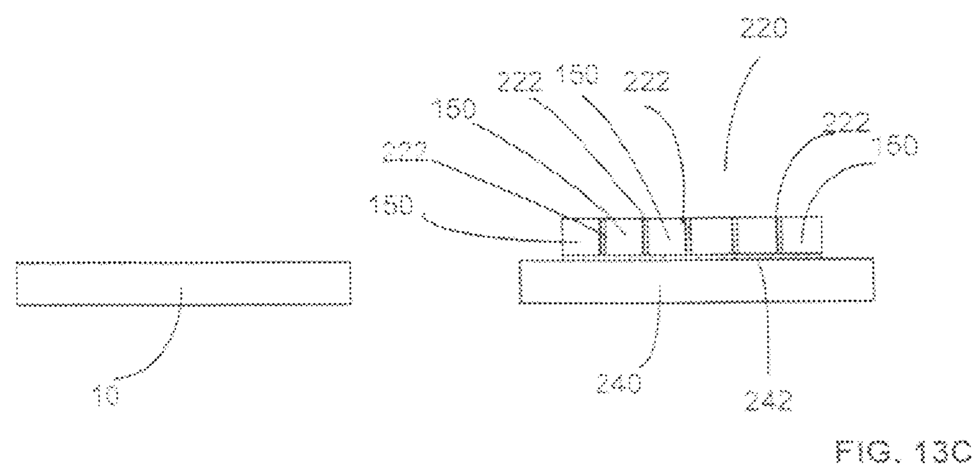

As shown in FIG. 13C, after connected display element array 220 has been transferred to destination substrate 240, connected display element array 220 may be connected to destination substrate 240. Connection 242 between connected display element array 220 and destination substrate 240 may be formed by various methods, as described previously in connection with FIGS. 10-12. The most appropriate choice of method for fowling connections will be dependent on the nature of the display elements used to form the display element array.

FIG. 14A-FIG. 14D illustrate the assembly of display elements into an array using a liquid as a substrate. For ease of use of a liquid as a substrate, density and chemical properties (especially surface tension) of the liquid are selected appropriately with respect to the density and chemical properties of the display elements, so that display elements may float on top of the liquid and be capable of moving about on the surface of the liquid and forming preferred associations with other display elements.

In one exemplary embodiment, water or an aqueous solution is used as the liquid, and the display elements having densities lower than water are used. Lower surface of the display elements may be mildly hydrophilic, while sides and upper portions may be hydrophobic, thus promoting correct up-down orientation of display elements. Sides of display elements may have additional characteristics that promote preferred associations to be formed between different display elements.

Figure 14A:
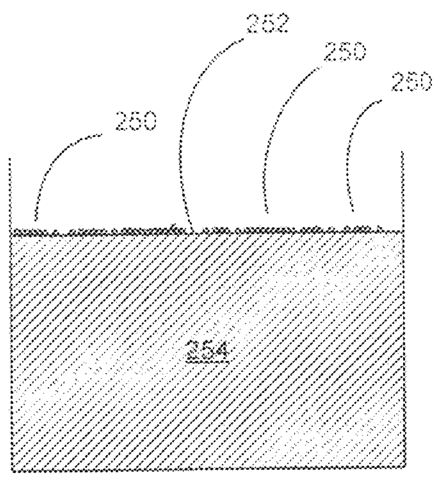
FIGS. 14A-14D illustrate assembly of display elements on a liquid substrate.
Figure 14B:
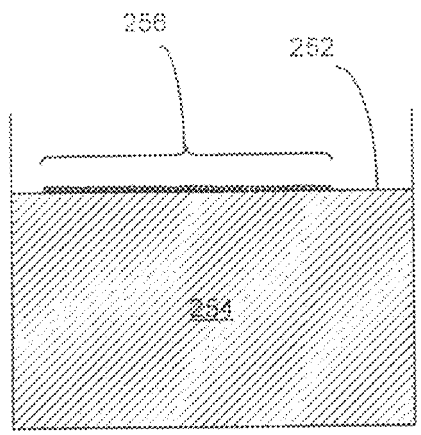
Figure 14C:
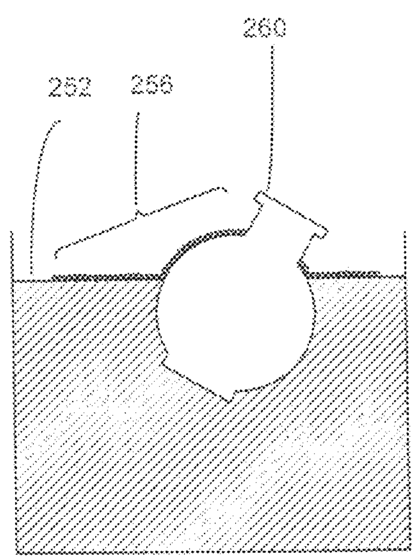
Figure 14D:
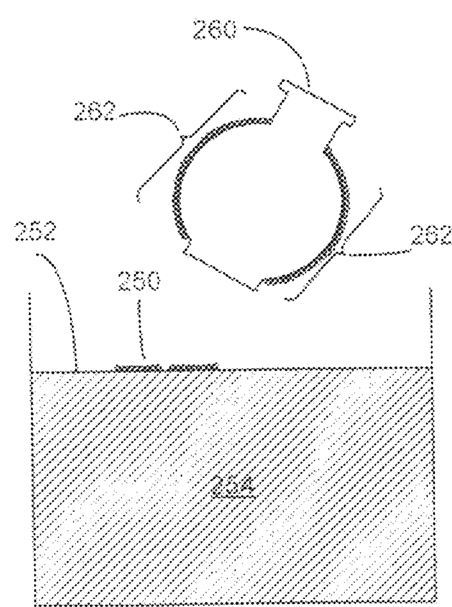

An initial stage in which display elements 250 are disposed on surface 252 of liquid 254 is depicted in FIG. 14A. In FIG. 14B, display elements 250 have self-organized into an array 256 of display elements arranged in preferred associations. Appropriately selected display element surface properties (e.g., hydrophobic sides) make groups of display elements 250 energetically favored relative to isolated display elements on the surface of the liquid. As shown in FIG. 14C, the grouped display elements may be transferred to substrate 260 by lowering substrate 260 into liquid 254, and lifting it up through self organized array 256 so that it adheres to at least a portion of the surface of the substrate 260 to form a coating 262 made up of display elements 250 in a self organized array, as depicted in FIG. 14D.

The method depicted in FIGS. 14A-14D may be useful for forming display element arrays on non-planar substrates, but also may be used with any substrates having suitable surface properties. Display elements that have self organized into a display element array on the surface of a liquid and are subsequently transferred to a substrate may be adhered to each other and/or to the substrate by various methods, as described previously in connection with other embodiments.

Display elements may be made up of one or more light emitting elements and a carrier which houses, supports, contains, or surrounds the light emitting element(s). A display element suitable for assembly into multicolor displays having a plurality of elements may include a light emitting element capable of emitting light in respective range corresponding to one or more of the colors of the display and a carrier in which the light emitting element is housed. The carrier may be characterized by at least one surface or shape property, or a combination of shape and surface properties. The carrier thus provides the surface or shape properties that are characteristic of the display element. The carrier may have defined shape or surface properties, selected to preferentially locate the display element with respect to other display elements in a desired color pattern to form a multicolor display. The display element may include at least one contact for forming an electrical or optical connection with a substrate or another display element. The display element may include a radio receiver for receiving an RF control signal. The display element may include a power signal input. The power signal input may include a receiver coil for receiving power inductively. The power signal input may receive power by various methods, and is not limited to any particular type of power input. Some further examples include photovoltaic, fluorescent, and electrochemical delivery of power. The display element may include a battery or other power source.

Light emitting elements may be organic or inorganic wavelength converters, phosphors, fluors, laser diodes, light emitting diodes, organic light emitting diodes, polymer light emitting diodes, quantum dots, polymers, electroluminescent and chemiluminescent devices, or nonlinear optical materials. Light emitting elements may be capable of emitting light in a wavelength band corresponding to one or more colors, responsive to a control signal. Light emitting elements may emit light in response to an electrical control signal (e.g., current or voltage), an electromagnetic control signal (e.g., an electron beam or incident light). Various types of display elements may be used in the different embodiments. Display elements may include light emitting elements in some embodiments. In some embodiments, display elements may include other forms of light modulating elements having light spectral characteristic, and not limited to light emitting elements. For example, other types of display elements may absorb, reflect, scatter, or otherwise modulate or modify light impinging on the display to provide a particular visually detectable effect on the display, in which case display elements have a characteristic light absorption spectrum or light reflection spectrum, instead of or in addition to a light emission spectrum.

Figure 15:
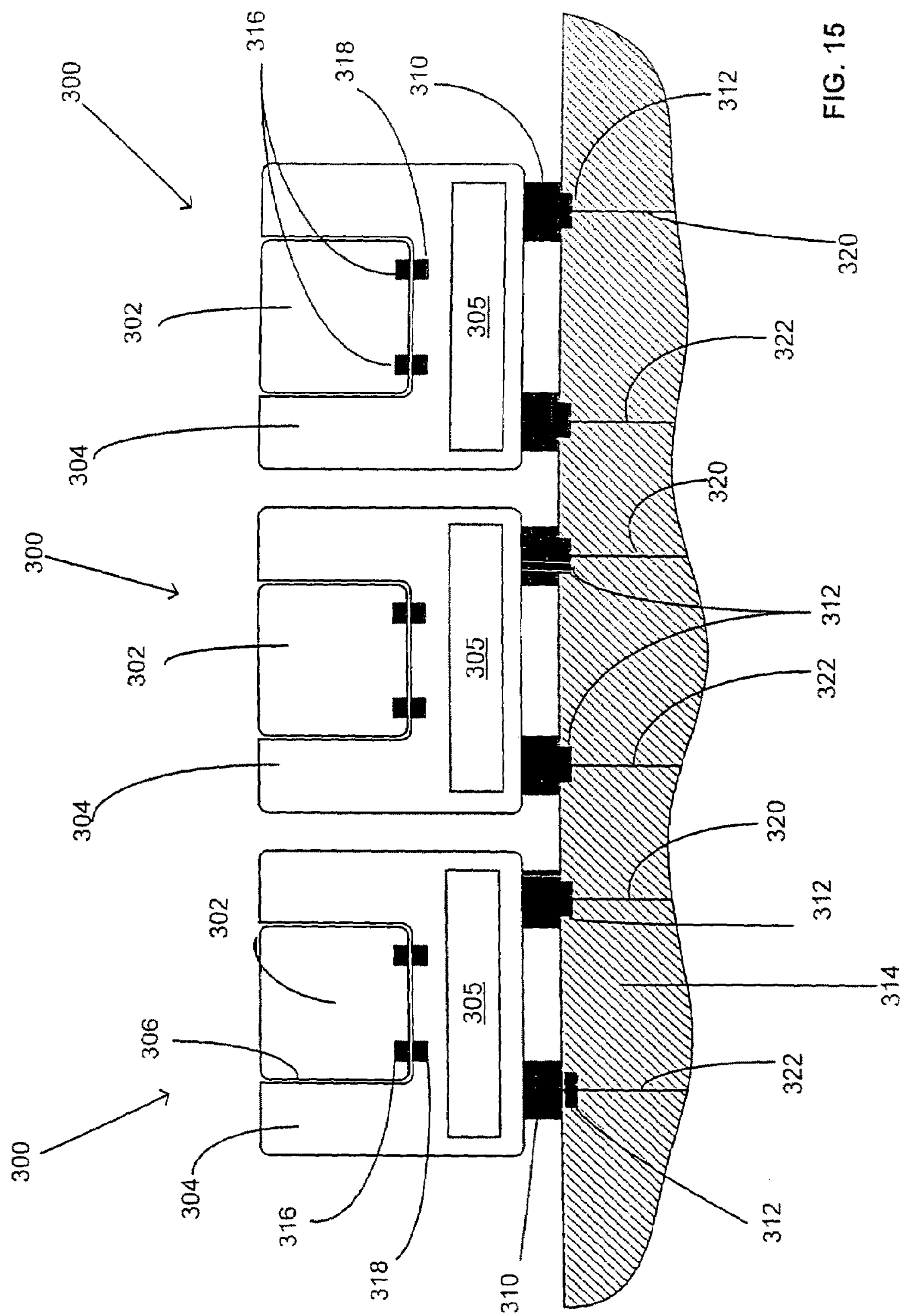
FIG. 15 shows an alternative embodiment of display elements on a substrate.

In one exemplary embodiment shown in FIG. 15, display element 300 includes light emitting element 302 and carrier 304. Carrier 304 may include recess 306 into which the light emitting element 302 is placed subsequent to manufacture of the light emitting element and the carrier, as shown in FIG. 15. In this embodiment, display elements 300 include electronic circuitry 305. Power and control signals may be delivered via lines 320 and 322 respectively, in substrate 314. Each display element 300 includes electrical contacts 310 in carrier 304 which can be connected to contacts 312 in substrate 314 for making connections between display element 300 and substrate 314. As depicted in FIG. 15, light emitting element 302 may be formed separately from carrier 304. Light emitting element 302 fits into recess 306 in carrier 304, where contacts 316 on light emitting element 302 and contacts 318 in recess 306 form a connection by which signals used to activate light emitting element 302 to produce light can be delivered. Light emitting element 302 and carrier 304 may be produced by standard fabrication techniques, including for example, injection molding of a plastic body around a semiconductor-based light emitting element.

Figure 16:
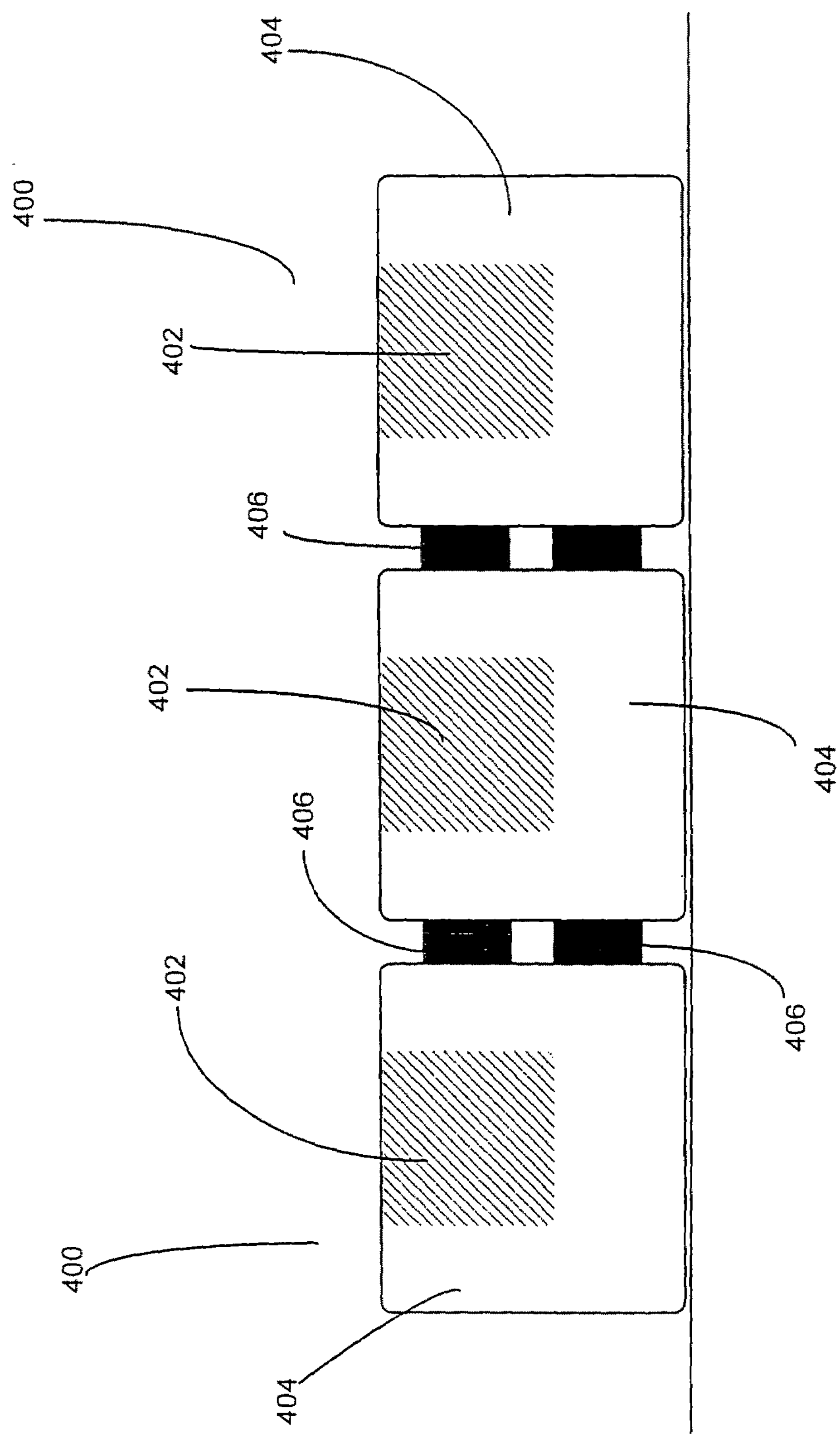
FIG. 16 depicts a further embodiment of assembled display elements.

FIG. 16 depicts an alternative embodiment of a display element 400 in which light emitting element 402 is formed integrally with carrier 404. Carrier 404 may be a silicon structure in which semi-conductor based electronic circuitry has been formed. Light emitting element 402 may be, for example, a light-emitting diode or laser diode, either of which can be formed in an integrated semiconductor device. Contacts 406 may provide for the transmission of power and/or control signals between display elements 400.

In some embodiments the light emitting element is formed integrally with the carrier and no clear distinction can be made between display element, light emitting element, and carrier, the carrier feature of the display element residing in the surface characteristic of the external portion. The carrier may include or be fanned from a polymeric material, a semiconductor material, or other materials. The light emitting element may be formed integrally with the carrier, or it may be formed separately from the carrier and subsequently integrated into the carrier. In one approach, the body forming material may itself include a light emitting properties. For example, all or a portion of the body may be formed from a light emitting material such as that used in organic LEDs.

Figure 17:
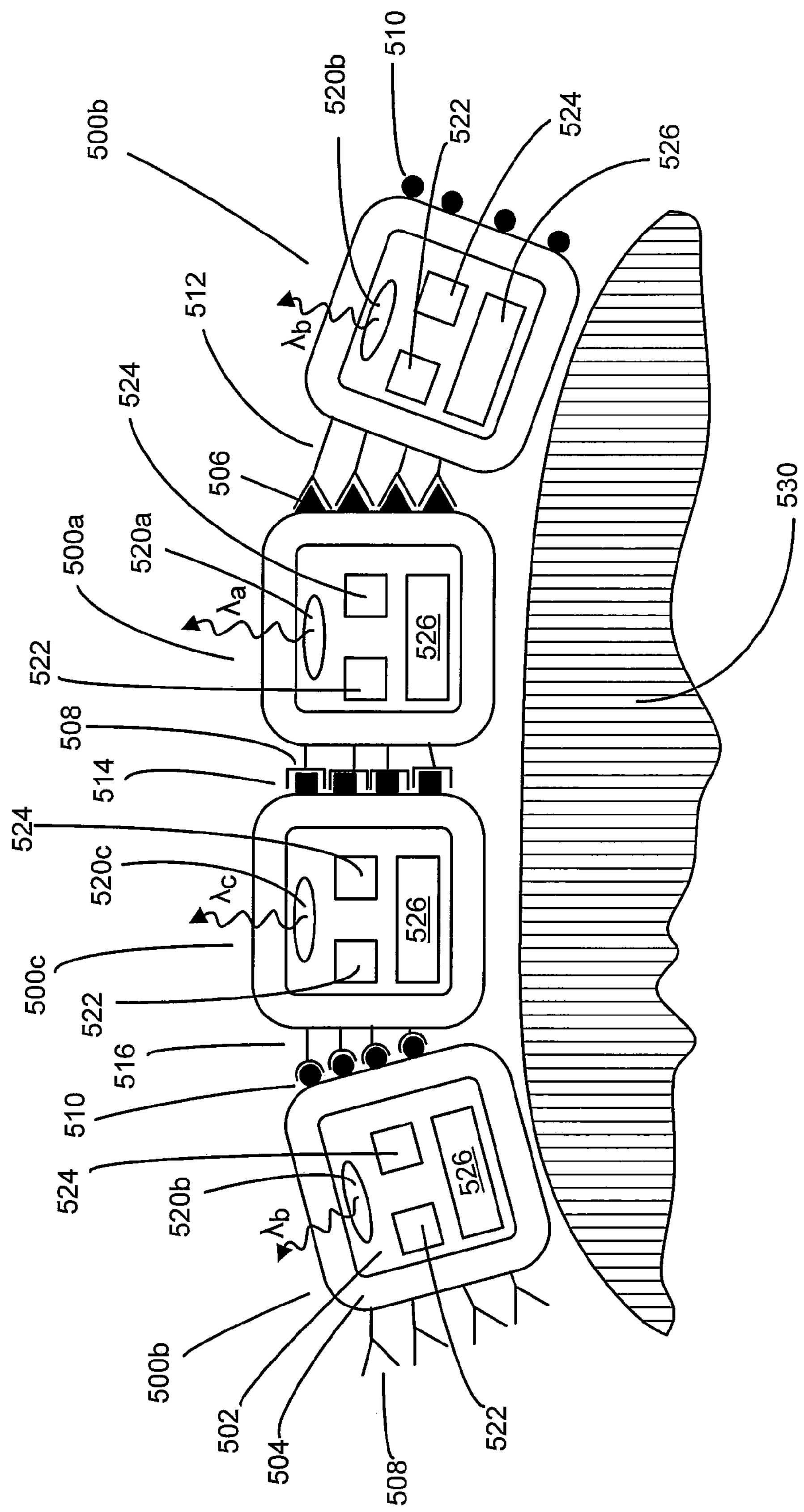
FIG. 17 depicts display elements on a non-planar substrate.

In another embodiment, depicted in FIG. 17, a display element 500 (e.g., 500*a*, 500*b*, 500*c*, or 500*d*) may include light emitting element 502 and carrier 504. Carrier 504 may take the form of a coating applied to the exterior of light emitting element 502. Carrier 504 may be applied to light emitting element 502, for example by dipping the light emitting element 502 into a material that will form carrier 504, by spraying a material that will form carrier 504 onto the light emitting element, or by other methods known in the art. Carrier 504 may include or be formed of one or more materials with a surface property that promotes self-organization of display element 500 with other display elements.

These and other methods of forming light emitting elements may include multi-step processes, including a separate step of applying or forming a surface characteristic on one or more selected regions of the carrier. This step may be performed before or after the carrier and light emitting element have been joined together. Methods of applying or forming surface characteristics may themselves be multi-step processes (e.g., methods of attaching biomolecules to surfaces as referenced in Montemagno and Bachard, Nanotechnology, Vol. 10, pp. 225-231, 1999; Chung et al., Small, Vol. 1, pp. 1-5, 2005; Published U.S. Patent Application US 2004/0023414 A1; and U.S. Pat. No. 6,809,196, all of which are incorporated herein by reference).

In the embodiment of FIG. 17, display elements 500*a*, 500*b*, and 500*c* are supported on a substrate 530 having a non-planar surface. Three distinct types of display elements (500$a$, 500$b$, and 500$c$) are depicted. Each display element 500 (of which display elements 500$a$, 500$b$ and 500$c$ are specific cases) include light emitting element 502 surrounded by carrier 504. Light emitting element 502 includes light source 520, control circuitry 522, a transceiver 524, and a power source 526. Different display element types are characterized by different light source; e.g. light source 520$a$ in display element 500$a$ emits light of wavelength band $\lambda_a$, light source 520$b$ in display element 500$b$ emits light of wavelength band $\lambda_b$, and light source 520$c$ in display element 500$c$ emits light of wavelength band $\lambda_c$. Carrier 504 has one or more surface characteristics that enable each display element 500 to form preferred associations with display elements of other types. For example, display element 500$a$ includes first surface property 506 and third complementary surface property 508, display element 500$b$ includes second surface property 510 and first complementary surface property 512, and display element 500$c$ includes third surface property 514 and second complementary surface property 516. As illustrated in FIGS. 1-3, first, second and third surface properties 506, 510, and 514, associate preferentially with their complements, first, second and third complementary surface properties 512, 516, and 508, respectively, to produce self organization of display elements 500$a$, 500$b$, and 500$c$ into a preferred arrangement. Because display elements 500$a$, 500$b$, and 500$c$ include power source 526 and transceiver 524, connections between display elements 500 and between display elements 500 and substrate 530 are not required to provide for the transmittal of power or data, and may only provide mechanical support and/or spatial positioning. Transceiver 524 allows data and control signals to be sent between display elements 50 and external control circuitry without electrical connections between display elements. Power source 526 may be a battery or other power generating or collecting device or structure, such as a photovoltaic cell, an inductive coil, an antenna, or an energy scavenging device. In certain embodiments, power source 526 may be a frequency-shifting or energy-conversion device, such as a fluor or phosphor.

As described above, display elements may be connected to each other or to a substrate by application of one or more of heat, vibration, pressure, chemical treatment, or an adhesive. Connecting groups of associated display elements or individual display elements to each other or to a substrate may include forming connections for transmitting data or power. Such connections may include electrical or optical connections. As an alternative to direct (mechanical, electrical, or optical) connections, power, data, or control signals may be transmitted to display elements via remote or wireless connections. Display elements may include transmitters, receivers, or transmitter-receiver (transceiver) combinations for sending RF or other signals. Power may be transmitted to display elements by various methods, including inductive coupling or power beaming, as well as via direct electrical connections.

Display elements may be responsive to one or more control signals. Control signals may include electrical signals transmitted via electronic circuitry, electromagnetic signals transmitted to display elements via a transmitter and received by a receiver (or transceiver), optical signals delivered via optical circuitry or electromagnetic signal. In some embodiments, control signals may be transmitted via chemical, electrochemical, and/or biochemical signaling. A control signal may produce emission of light by a light emitting element directly (e.g., in the case of an electron beam, UV beam, or other energy striking a phosphor to cause emission of light) or a control signal may be processed by electronic or optical circuitry on the light emitting element to control light emission indirectly, in which case the control signal may initiate, stop, or otherwise modulate the emission of light by light emitting elements. Such modulation may include various other modifications, as may be devised by those of skill in the relevant arts, including, but not limited to, shifting light direction or polarization, modulating light spectral properties, or modulating a pulse-repetition pattern.

A variety of approaches to selectively activating individual elements, or groups of elements may be implemented. In a straightforward N×N or M×N array of elements, conventional row and column addressing, such as that found in many matrix array structures, such as LCDs may be appropriate. The control electronics and tradeoffs for such addressing and selective activation are known to one of skill in the art.

Figure 18:
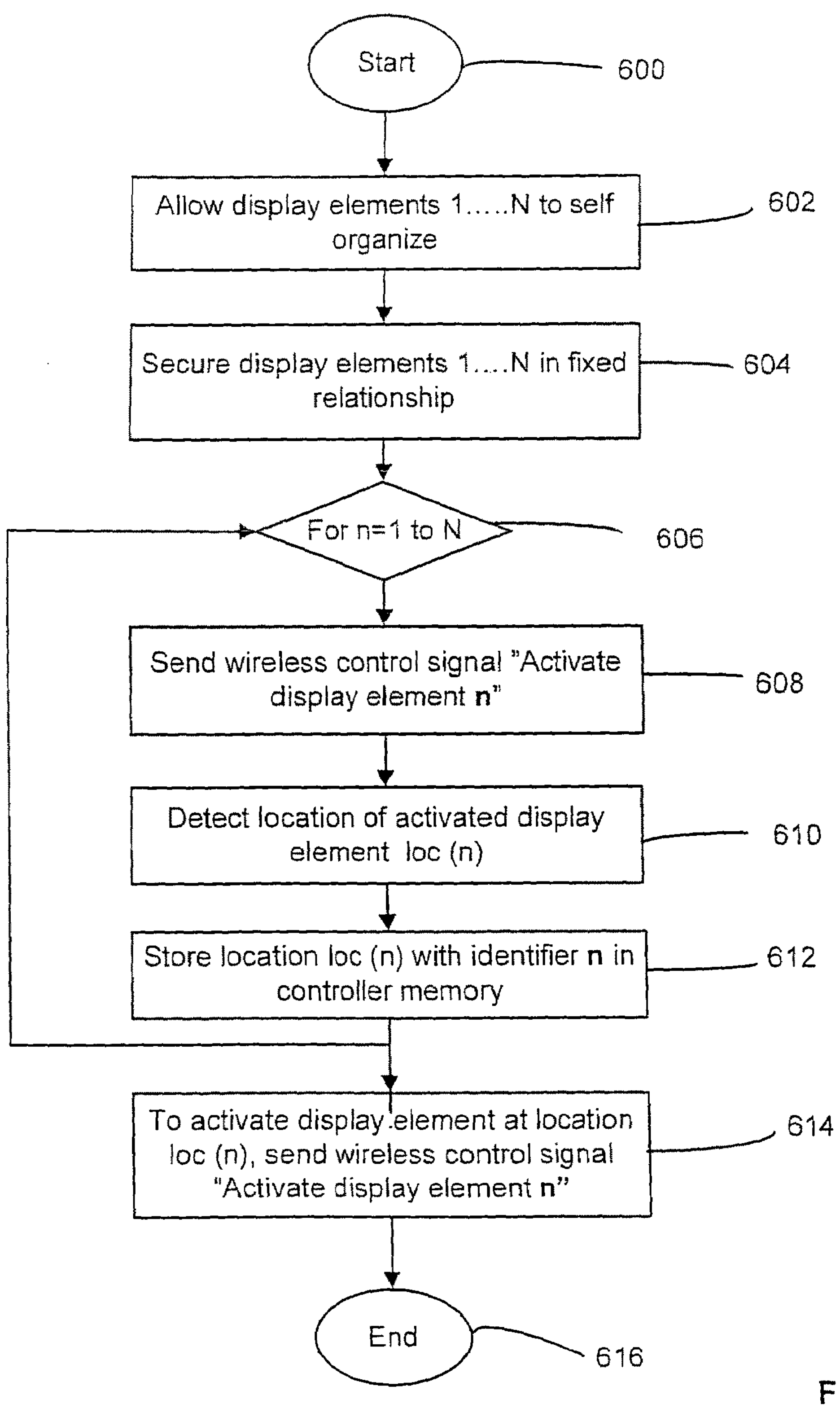
FIG. 18 depicts a display assembly process.

FIG. 18 illustrates a process for forming a self-organized array and establishing the location of specific display elements within the self-organized array. This process may be used in systems in which display elements have individual identifiers (e.g., identification codes or numbers) and are controlled by wireless control signals, though modifications of the approach may applied for systems with connections other than wireless. The location of specific display elements must be determined after the display elements have self-organized into the array. At step 602, display elements 1 through N are allowed to self-organize. At step 604, display elements 1 through N are secured in fixed relationship to one another. Subsequent steps are carried out for display elements 1 to N, as controlled at step 606 (or by an equivalent control loop). At step 608, a wireless control signal containing the instruction "Activate display element n" is sent to all display elements. At step 610, the location of activated display element n, designated by loc(n), is detected. At step 612, loc(n) is stored in the memory of a controller, along with the identifier n. Process control returns to step 606, and steps 608 through 612 are repeated for all values of n between 1 and N. When steps 608 through 612 have been repeated for all values of n, training or configuration of the system is complete, and use of the system may commence as represented by step 614. At step 614, a display element at a desired location loc(n) is activated by sending a wireless control signal containing the instruction "Activate display element n." Suitable wireless control signals may be sent out for as long as desired to activate one or more display elements at a time in a desired pattern.

Figure 19:
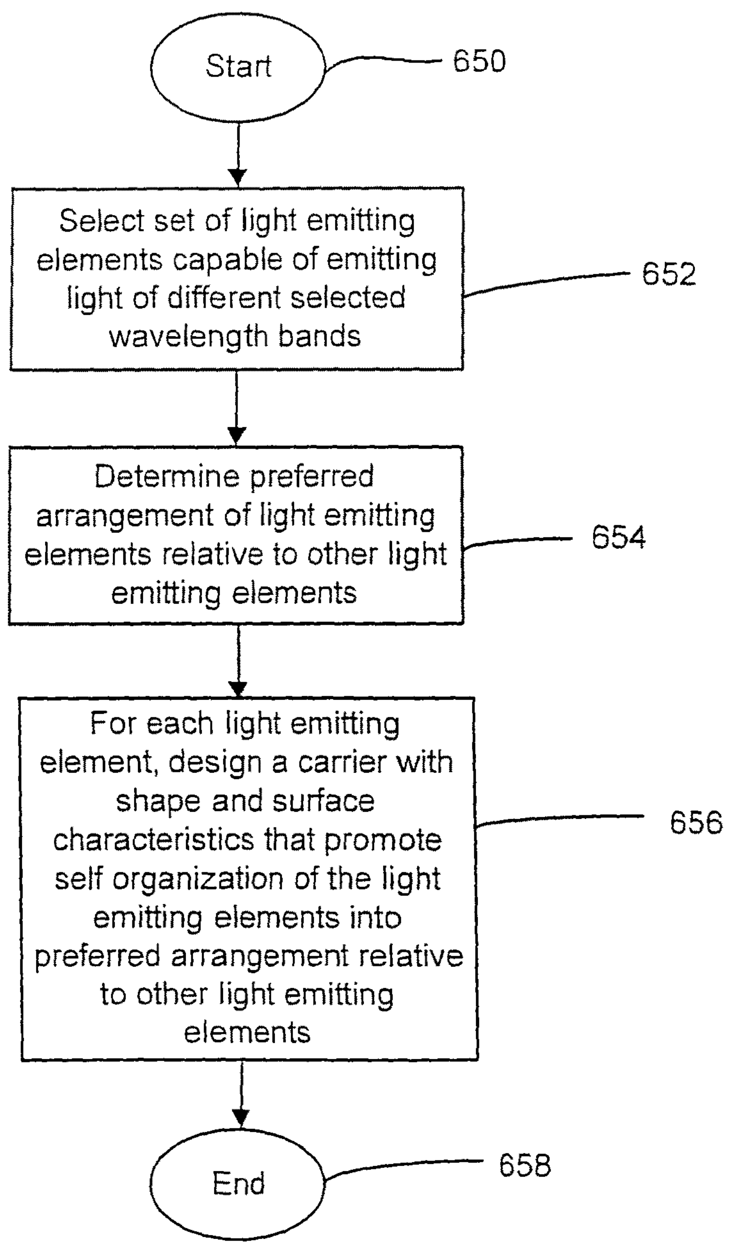
FIG. 19 depicts a display element design process.

FIG. 19 outlines a process for designing display elements to form self-organizing arrays. At step 652, a set of light emitting elements capable of emitting light of different selected wavelength bands is selected. Using the embodiment of FIGS. 1-3 as an example, this step would involve selecting a first display element type 20, second display element type 30, and third display element type 40, selected to provide light in a red wavelength band, green wavelength band, and red wavelength band, respectively. In some cases, display element sets may include display elements that differ not by color, but by some other functional characteristic: for example, a display element set might include two different display elements that emit red light, one emitting light in a narrow wavelength band and one emitting light in a broad wavelength band. Display elements may be distinguished from each other by various other characteristics, of which the following are only exemplary: intensity of emitted light, power consumption, size, shape, wavelength band envelope, spectral width, spectral brightness, power, emission pattern (e.g. pulse repetition rate), polarity, response speed, and linearity. Moreover, as noted previously, display elements may have a characteristic spectral response that is not based upon light emission.

Next, at step 654 of FIG. 19, the preferred arrangement of light emitting elements relative to other light emitting elements is determined. The set of light emitting elements may include as many light emitting elements as are needed to form the basic pattern element repeated in the array. For example, in the embodiment depicted in FIGS. 1-3, the preferred arrangement of light emitting elements is triad 60, which may be arranged in a repeating pattern of array 50. The 'set' of light emitting elements includes display elements 20, 30, and 40. Display element types 20, 30, and 40 have surface properties selected to promote their association into triads 60 and array 50, as described previously. It should be noted that basic pattern elements formed by a set of display elements (of which triad 60 is one example) need not contain only a single copy of each display element type. For example, in some embodiments that employ red, green, and blue subpixels, it may be desirable to include two blue display elements for each red and green element. It would also be possible to form a basic pattern element that includes multiple copies of some or all display element types.

At step 656, a carrier is designed for each light emitting element, which has shape and surface characteristics that promote self organization of the light emitting elements into the preferred arrangement relative to other light emitting elements. For the embodiment of FIGS. 1-3, this step would include selecting surface characteristics at specific surface regions on each display element type.

In some embodiments, a method of designing a set of display elements includes selecting a set of light emitting elements, each of which is capable of emitting light of respective selected wavelength, and determining a preferred arrangement of the light emitting elements. It should be noted that, while reference is made to "light emitting" elements, in some embodiments, elements which modulate light in some other way to produce a visually detectable effect (e.g., by light reflection, refraction, scattering, or absorption) may be used in place of light emitting elements. The preferred arrangement specifies the position of light emitting elements capable of emitting light of each of said selected wavelength bands relative to light emitting elements capable of emitting light of other selected wavelength bands. The method further includes designing an attribute set for each light emitting element of the set of light emitting elements, where each attribute set is adapted to promote self-organization of the set of display elements according to the preferred arrangement. The set of light emitting elements according to the method may include a plurality of types of light emitting elements in which each type of light emitting element is characterized by a respective attribute set and is capable of emitting light of a respective selected wavelength band. According to the preferred arrangement, certain types of elements are attracted to and associate with certain other types of elements. In many cases, elements may be attracted to elements different than their own type. Certain types of elements may be repelled from and avoid associating with certain types of elements. In certain embodiments, elements may be repelled from and avoid associating with elements that are of the same type.

Figures 20, 21:
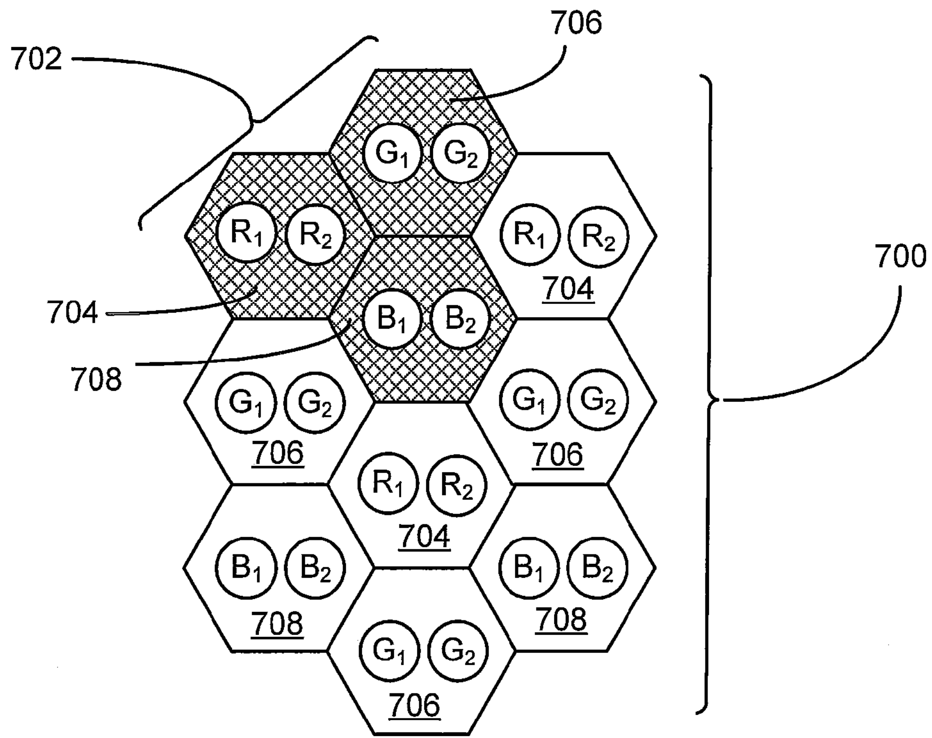
FIG. 20 shows an embodiment of a display element array.
FIG. 21 shows another embodiment of a display element array.

FIG. 20 illustrates a self organized display element array 700 that includes a display element set 702 shaded area). Each display element 704, 706, and 708, in display element set 702 includes multiple light emitting elements. In this example, each display element includes two light emitting elements of the same color which may, however, differ in terms of waveband or other characteristics. For example, $R_1$ emits broad waveband red light, while $R_2$ emits red light in a narrow waveband. Alternatively, $R_1$ and $R_2$ may be identical light emitting elements that are included in duplicate to provide redundancy, so that if one light emitting element fails, the other may serve as a backup. In another alternative, two identical light emitting elements may be included to provide a broader range of light intensities. In still another embodiment, two light emitting elements may emit light in bands having different central peaks. This may allow greater spectral coverage, or use of less expensive components while still providing light in a usable range.

FIG. 21 depicts a display element array 800 including display element set 802 (indicated by the shaded area), which includes display elements of four different types, 804, 806, 808, and 810. In this example, display elements 804 emit light in a first wavelength band, display elements 806 emit light in a second wavelength band, and display elements 808 and 810 emit light in a third wavelength band. Display elements 808 and 810 emit light of the same wavelength band but differ in another characteristic, e.g. power consumption, life span, etc.

The preferred arrangement may include a pattern having short-range order, a repeating pattern, or a pattern having long-range order. Patterns having either short-range order or long-range order may incorporate repeating patterns. In an embodiment particularly suited for the design of three color displays, such as are commonly used in television or computer screens, three distinct types of display elements that self-organize into triads are used. Each triad may include at least one red display element, at least one green display element, and at least one blue display element. In certain embodiments, sets of light emitting elements may include between two and ten different types of light emitting elements. According to one embodiment, sets of display elements are provided that are suitable for assembly into a multicolor display.

Each set of display elements may include a first set of light emitting portions having a first wavelength response and a first set of body portions each carrying a respective one or more of the light emitting portions in the first set of light emitting portions. Each body portion in the first set of body portions may have a first defined physical feature corresponding to the first wavelength response. The set of display elements may also include a second set of light emitting portions having a corresponding second wavelength response and a second set of body portions, each carrying a respective one or more of the light emitting portions in the second set of light emitting portions. Each body portion in the second set of body portions may have a second defined physical feature corresponding to the second wavelength response. The first defined physical feature is configured to preferentially associate with the second defined physical feature. Specifically, the first defined physical feature is configured to preferentially associate its respective body portion adjacently with a body portion in the second set of body portions.

Sets of display elements are not limited to any specific number of types of display elements, any number of display elements from only two to as many as ten or more different types of light emitting elements.

Figure 22:
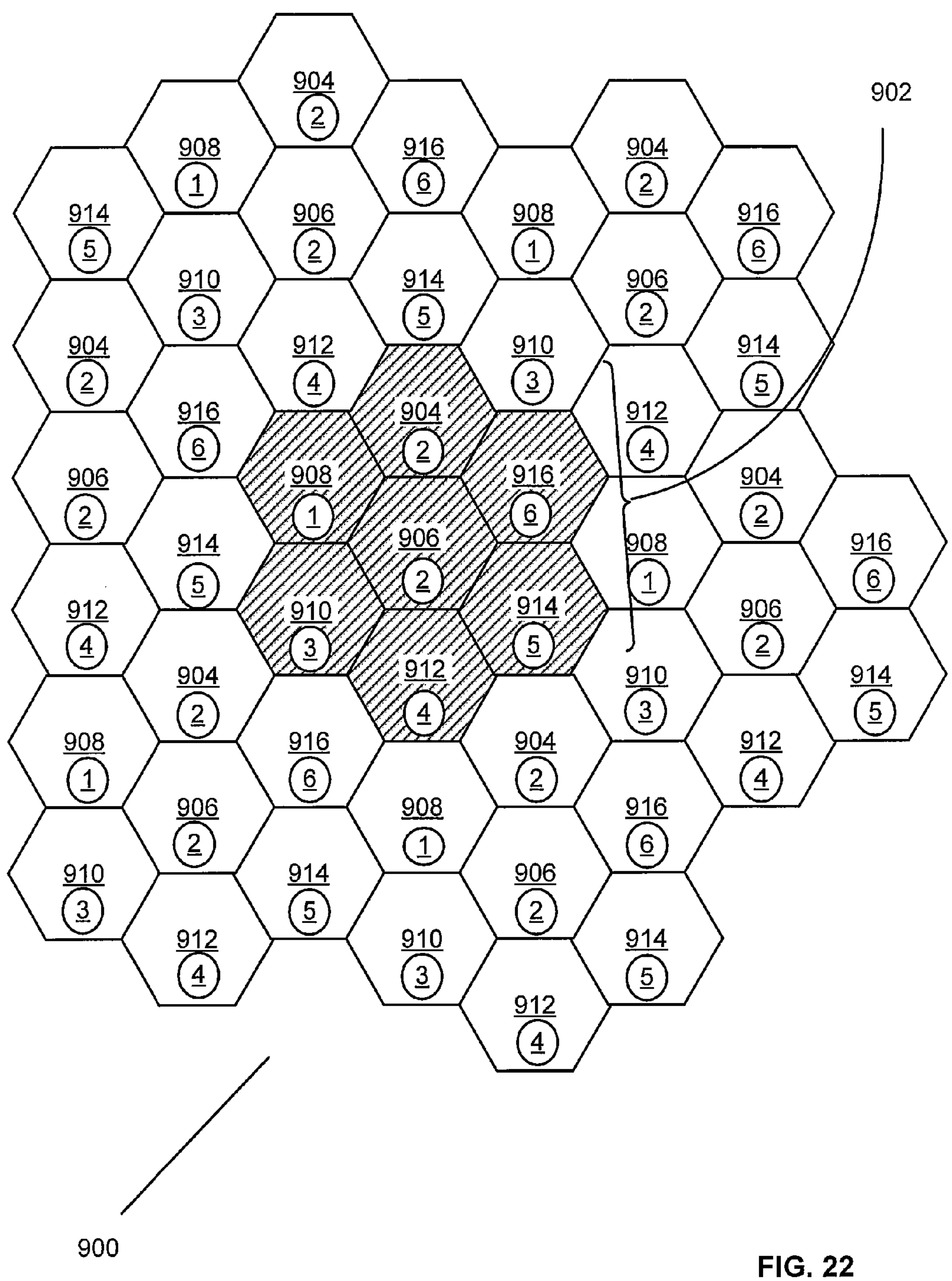
FIG. 22 shows another display element array.

FIG. 22 illustrates a display element array 900 in which the display element set 902 forming the basic pattern element includes a total of seven display elements, of which two (904 and 906) include the same type of light emitting or light modulating element (indicated by reference number 2). The remaining five display elements (908, 910, 912, 914, and 916) include display elements of different types (indicated by reference numbers 1, 3, 4, 5 and 6, respectively).

In some embodiments, a multicolor display includes a plurality of display elements in a self-organized array, in which the plurality of display elements includes two or more colors of display elements that are self-organized by color.

Each display element may have at least one nearest neighbor that is of a different color. Display elements of each color are characterized by at least one surface or shape property that promotes association of the display elements with other display elements of different colors and inhibits association of display elements with other display elements of the same color.

Design of display element sets for constructing self-organizing displays may include the design of substrates to operate in cooperation with display elements. Displays according to various embodiments may include a substrate on which a self-organized array of display elements is disposed. The substrate may have a planar or non-planar surface. Display elements may be attached to the substrate, or may simply rest upon and be supported by the substrate. The substrate may have a surface characteristic or property that interacts with a surface characteristic of at least some of the display elements to influence the orientation of display elements on the surface or distribution of display elements on the surface. Surface characteristics that may influence the orientation of display elements may include, but are not limited to, chemical composition, electric charge, surface energy, magnetic, shape or texture characteristics. The substrate may include electrical circuitry and contacts for sending power or data signals to one or more display elements disposed on its surface. The substrate may include optical circuitry and optical connections to display elements on its surface. Choice of substrate is strongly dependent on the intended application of the display element array, though general design principles apply to substrate and display elements across applications.

Self organizing and/or self-assembling display element arrays as disclosed herein may find application in a wide variety of devices and systems.

Figure 23:
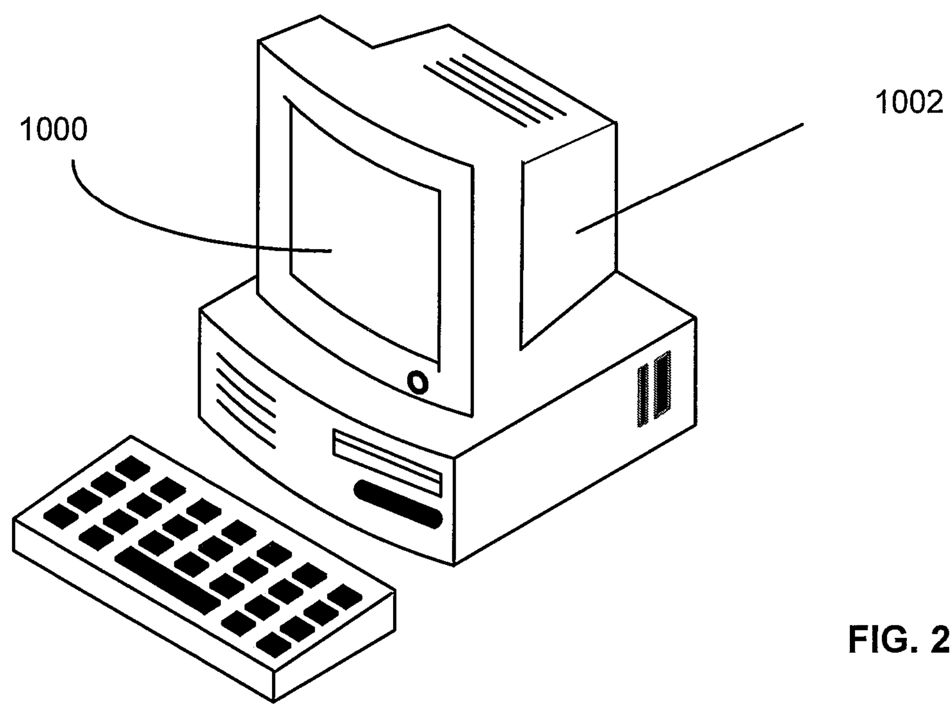
FIG. 23 depicts an embodiment used in a computer monitor.

FIG. 23 depicts application of a self-organizing display element array 1000 in computer monitor 1002.

Figure 24:
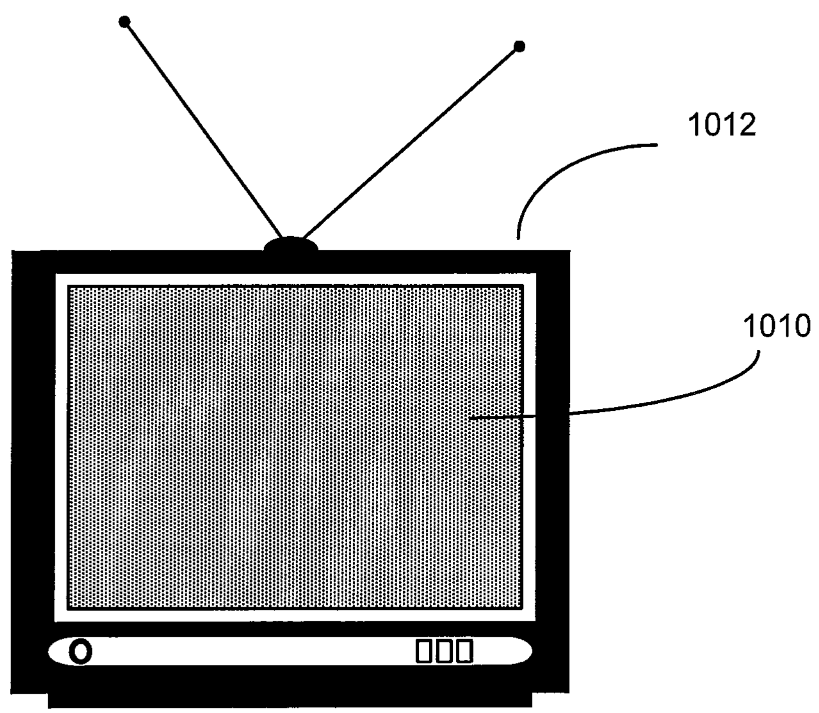
FIG. 24 depicts an embodiment used in a television screen.

FIG. 24 depicts application of a self-organizing display element array 1010 in a television screen 1012. It is increasingly the case that there is little distinction between television screens and computers monitors, as televisions include more interactive capabilities, and television screens include capabilities for displaying images in multiple windows, displaying menu option, and so forth.

Figure 25:
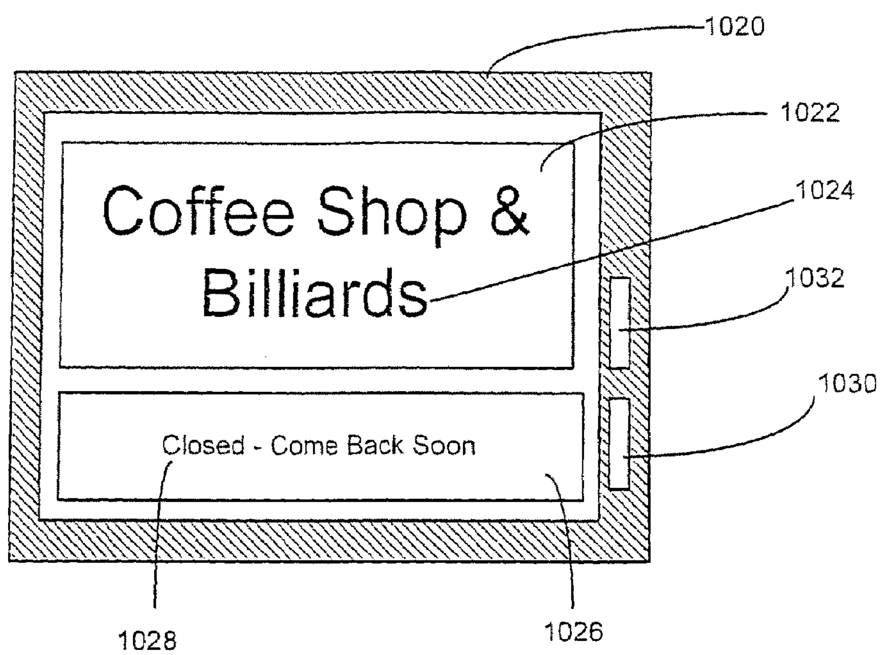
FIG. 25 depicts an embodiment used in an electronic sign.

FIG. 25 illustrates the use of self-organized display element arrays on a sign 1020. The example presented in FIG. 25 includes a static display portion 1022 that may be configured to display a static image 1024 (in this case, the text "Café & Billiards"), while dynamic display portion 1026 may be configured to display a message or image 1028 that may be changed at intervals. If desired, the dynamic display portion may display a continuously changing message or image (e.g. scrolling text or animated image). Static display portion 1022 and dynamic display portion 1026 may differ with regard to type and distribution of display elements, or with regard to the control signals used to control the display elements. Signs (and related displays, such as labels, advertisements, billboard, etc., which may also incorporate embodiments of the present invention) may be entirely static, or entirely dynamic, depending on their intended use. Sign 1020 may include battery 1030 and control circuitry 1032 mounted in or on sign 1020 for driving operation of static display portion 1022 and dynamic display portion 1024.

Figure 26:
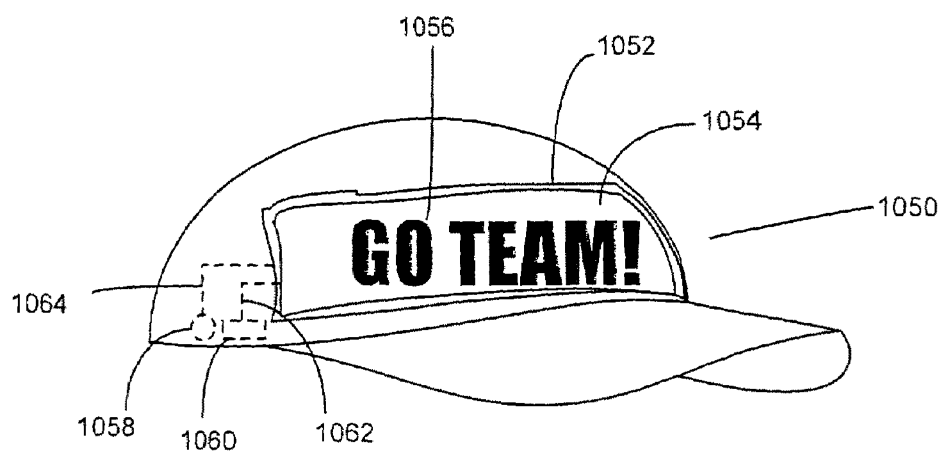
FIG. 26 depicts an embodiment used in an item of apparel.

Self organized display element arrays may also be used on items of apparel, or other decorative or function items formed of flexible fabric or material. As an example, FIG. 26 illustrates the use of a self-organized display element array on a baseball cap 1050. Baseball cap 1050 includes panel 1052 containing display element array 1054, which may be a flexible array. Text, images, or patterns, which may be either static or dynamic, may be displayed on display element array 1054. In the example shown in FIG. 26, display element array 1054 displays text 1056, reading "GO TEAM!" Display element array 1054 may be powered by various methods. As shown in FIG. 26, a small battery 1058 may be mounted on cap 1050 in an inconspicuous location (e.g, in the interior of cap 1050) and connected to display element array 1054 via lead 1064. Alternative power supplies may be used instead, e.g., a solar cell. Controller 1060, which may be an ASIC or a microprocessor based device may be mounted on cap 1050 and connected via one or more data lines 1062 to display element array 1054 to drive operation of display element array 1054.

Figure 27:
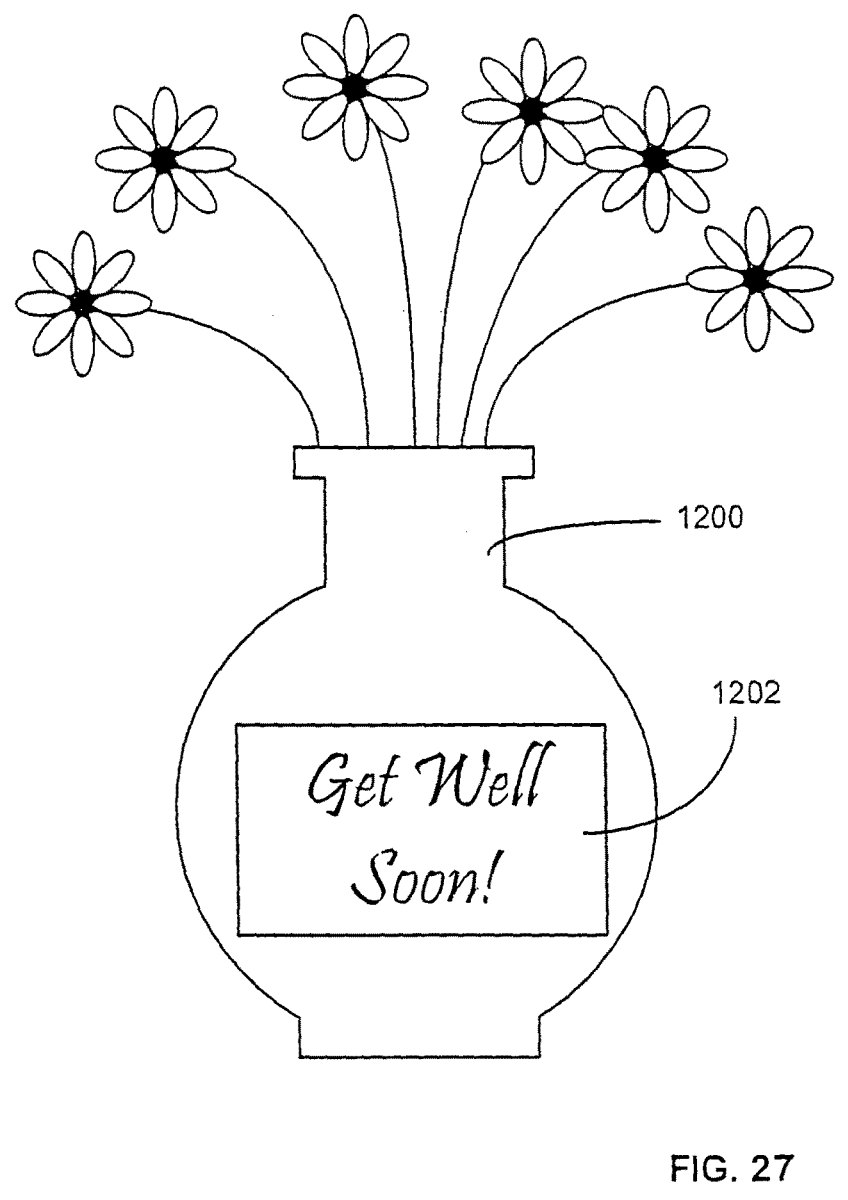

FIG. 27 illustrates the use of a self-organized display element assembly on a decorative item having a non-planar substrate, in this example, a vase 1200 bearing a panel 1202 displaying the message "Get well soon". The message "Get Well Soon!" may alternate with one or more other messages or images, may scroll across the panel, may flash, or may produce various other visual effects. Such variations of displays may be applied to any other embodiments in which a dynamic display element array, including but not limited to the examples presented herein. Vase 1200 may incorporate a battery or other power supply and control circuitry, as discussed in connection with the baseball cap embodiment depicted in FIG. 26.

Self organizing display element arrays may be used in virtually any setting in which it is desired to graphically display static or dynamic text, images, or patterns on a surface. As discussed previously, dynamic displays may be varied at intervals (for example, dynamic display portion 1026 in FIG. 25 may be changed from "Closed—Come back Soon" to "Open—Come on In"), or may be varied continuously to display scrolling or flashing text, animated graphic, or various other dynamic displays as may be devised by those of skill in the relevant arts. Display elements may be of a wide range of sizes, and display element arrays or displays formed from such display elements may be of a wide range of sizes and resolutions, depending on intended application and construction method and materials. Text, images, and patterns formed through the use of such displays may be informative, decorative, or functional. Such displays may be used in or on a wide variety of decorative and/or functional items, to convey information or to change the appearance of an item in a functional manner (e.g., camouflage on a vehicle or item of clothing), or to present a desired decorative appearance on various items (objects, items of apparel, etc., signs, labels, artwork.)

Figure 28A:
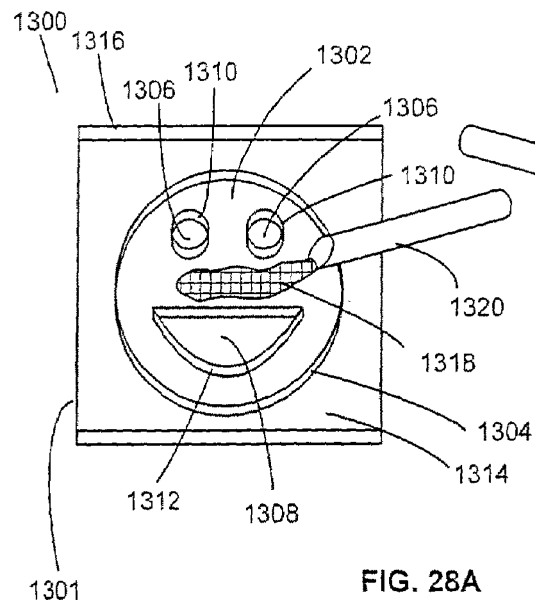
FIGS. 28A-28D illustrate the manufacture of a display having several regions.
Figure 28B:
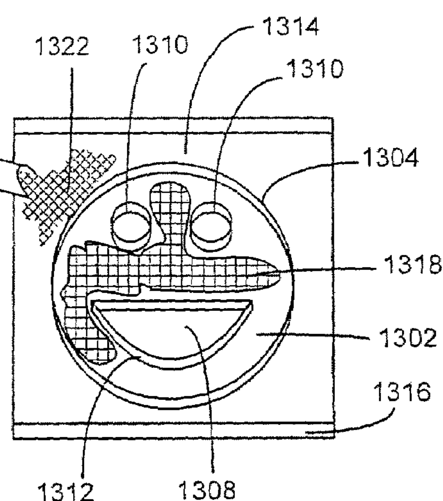

FIGS. 28A-28D illustrate the manufacture of a display having several regions containing self-organized display element arrays of different types. In the example depicted in FIGS. 28A-28D, display 1300 includes a first display region 1302 on a substrate 1301, which defines a face portion of a "smiley face". First display region 1302 is surrounded by barrier 1304. Two eye portions 1306 and mouth portion 1308 are set off from first display region 1302 by barriers 1310 and 1312, respectively. Second display region 1314, which forms a background to the smiley face, is separated from first display region 1302 by barrier 1304 and bounded by barrier 1316. In FIG. 28A, a first plurality of display elements 1318, in a quantity sufficient to fill first display region 1302, is added to first display region 1302 from dispenser 1320. In FIG. 28B, a second plurality of display elements 1322, in a quantity sufficient to fill second display region 1314, is added to second display region 1314 from dispenser 1324. First plurality 1318 and second plurality 1322 of display elements may differ in one or more characteristics. Each plurality may be formed of a single type of display element, or two or more different types of display elements. For example, the first plurality may be made up of display elements of a first color (e.g., yellow), while the second plurality may be made up of display elements of a second color (e.g. blue). Alternatively, one or both of the first and second plurality may be made up of multiple types of display elements, for example, the first plurality may be made up of a mixture of orange and yellow display elements, while the second plurality of display elements may be made up of a mixture of green and blue display elements. As another alternative, the first and second plurality may include display elements of the same types in different proportions, for example, the first plurality may include one-third red display elements, one-third blue display elements, and one-third green display elements, while the second plurality may include half red display elements, and one quarter each of blue display elements and green display elements.

Display elements may differ by other characteristics than color, e.g., size, power consumption, spectral waveband, etc., and may differ by one or by multiple characteristics. The choice of display elements used in each region may be based on the text, pattern, or image that is to be displayed. If the display is intended to display a fixed pattern (e.g., the smiley face depicted in FIGS. 28A-28D) the display element characteristics may be selected to be suitable for the pattern. For example, the face portion of the smiley face may be yellow, and the background blue. The eyes and mouth portions may be black (in which case there may be no need to provide display elements that emit light in these portions). In the sign as depicted in FIG. 25, static display portion 1022 may include a first mixture of display elements suitable for displaying the intended static image or text, while the lower portion may include a different assortment of display elements, e.g., larger display elements in a single color, suitable displaying the intended basic text but insufficient for displaying an image or more elaborate text.

Figure 28C:
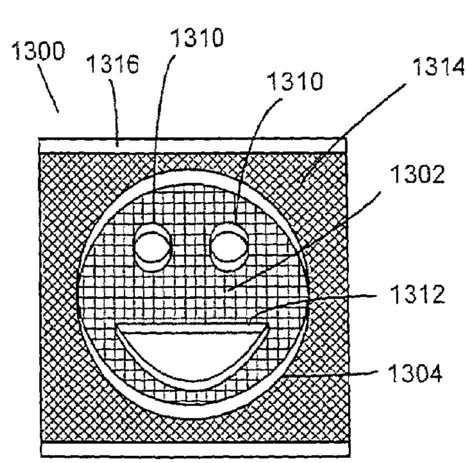
Figure 28D:
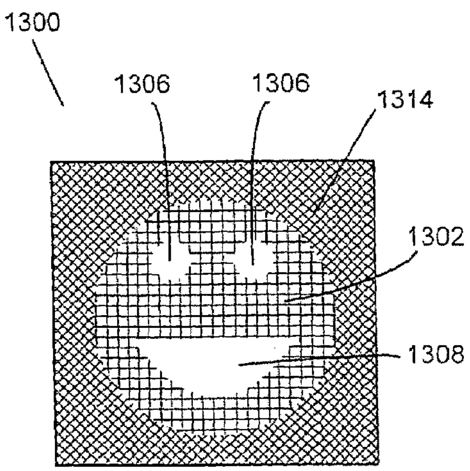

Returning to FIG. 28B, following loading of display elements into first display region 1302 and second display region 1314, the system may be agitated to cause the display elements to self organize to form display element arrays within their respective display regions. FIG. 28C illustrates display 1300 following formation of self organized display element arrays within first display region 1302 and second display region 1314. Barriers 1310, 1312, and 1316 remain in place between the different regions of display 1300. Display elements may be secured to each other and to substrate 1301 either before or after removal of barriers 1310, 1312, and 1316, depending on the specific types of display elements and substrate used. Barriers 1310, 1312 and 1316 may be removed from the completed display 1300, as depicted in FIG. 28D. Alternatively, in some embodiments, barriers between display portions may form a part of the completed display.

Figure 29A:
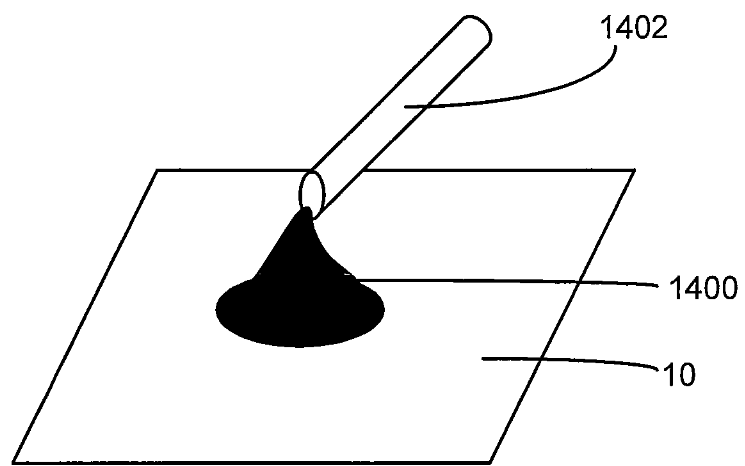
FIG. 29 illustrates sequential distribution of display elements on a substrate.
Figure 29B:
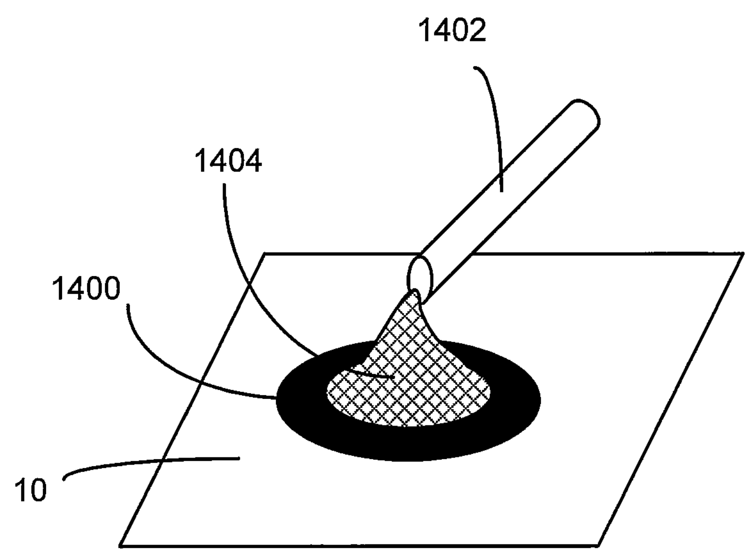

FIGS. 29A and 29B illustrate a method of forming a non-uniform distribution of display elements on a substrate. In FIG. 29A, a first quantity of display elements 1400 (which may include a first mixture of display elements) is disposed onto substrate 10 from dispenser 1402 during a first time interval $t_1$. First quantity of display elements 1400 may have physical characteristics (size, surface properties, density, etc.) that cause first quantity of display elements 1400 to spread out onto substrate 10 or may be in a mixture (e.g., with a liquid, gas or solid) that confers suitable spreading properties to first quantity of display elements 1400. In FIG. 29B, a second quantity (type or mixture) of display elements 1404 is disposed onto substrate 10 from dispenser 1402 during a second time interval $t_2$. Second quantity of display elements 1404 spreads out onto substrate 10, causing further outward spreading of first quantity of display elements 1400. The approach illustrated in FIGS. 29A and 29B exemplifies how a spatially non-uniform distribution of display elements on a substrate may be obtained by distributing different types or mixtures of display elements to the same location of a substrate at different times.

Figure 30:
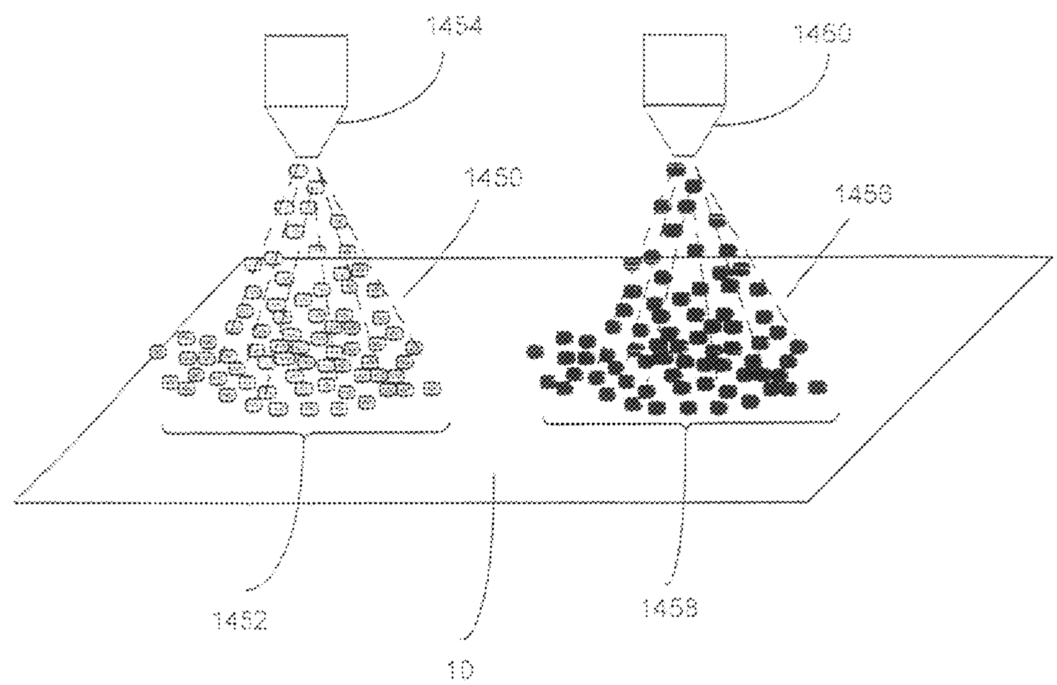
FIG. 30 illustrates distribution of display elements on several regions of a substrate.

FIG. 30 illustrates how display elements may be delivered to a substrate surface at two or more locations, by the use of multiple delivery devices. First quantity of display elements 1450 is delivered to first location 1452 on substrate 10 from first delivery device 1454. Second quantity of display elements 1456 is delivered to second location 1458 on substrate 10 from second delivery device 1460. Substantially the same result could be obtained by using a single delivery device and moving the delivery device (which may be, for example, nozzle, spout, inkjet, pressure jet, sprayer, etc.) with respect to the substrate, or moving the substrate with respect to the delivery device. By delivering different display elements (i.e., different types of display elements or mixtures of the same types of display elements in different proportions) at the different locations, a spatially non-uniform distribution of display elements on the substrate may be obtained.

Various of the exemplary embodiments disclosed herein (e.g., in FIGS. 1-3, 6, and 20-22) include display elements arranged in regular, rectilinear N×N or M×N arrays. However, as used herein, the term "display element array" applies not only to regular, rectilinear arrays, but also to arrays formed from various other associations of display elements, including arrangements of display elements that are non-uniform with respect to various parameters, including, but not limited to spacing, orientation, size, and type of display elements. As illustrated in FIGS. 28, 29, and 30, display element arrays may include two or more distinct regions, configured so that within each region the display element array is regular and uniform, but between regions and across the display element array as a whole, there is a non-uniform, irregular distribution of display elements. Display element arrays may also include arrangements of display elements that do not include uniform regions but are non-uniform as a whole. Non-uniform distributions may include gradients with respect to display element size, color, etc., for example, running from one side of a display element array to another, or from the center of a display element array to the edges. Non-uniform display element arrays may be non-uniform but have a statistical distribution of display elements over some or all of the array. In certain embodiments, spatial distribution of display elements over an array may be random or quasi-random.

Figure 31:
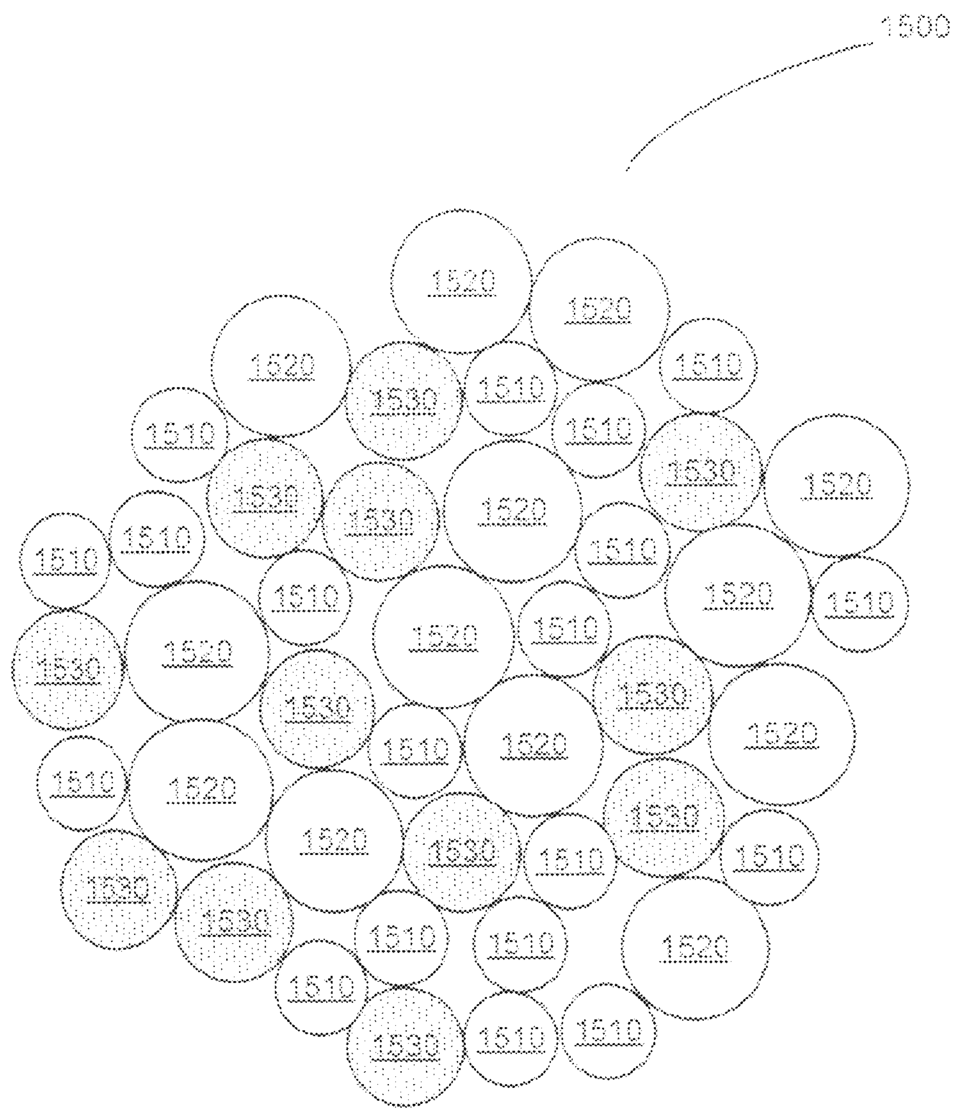
FIG. 31 illustrates an alternative embodiment of a display element array.

FIG. 31 illustrates a display element array 1500 having a substantially random distribution of display elements of types 1510 and 1520. FIG. 31 also illustrates the use of spacer elements 1530 within display element array 1500. In general, spacer elements are elements of a display element array may not themselves function as display elements, with regard to emitting or modulating light, but which may be positioned between other display elements to modulate the spacing of other display elements within the array. In some embodiments, an individual spacer element may be characterized by at least one surface or shape property that promotes association of the spacer element with display elements such that the spacer element moves to a preferred location with respect to the display elements within a preferred arrangement of display elements. In other embodiments, as illustrated by the exemplary embodiment in FIG. 31, display elements 1510 and 1520 may be distributed substantially randomly across display element array 1500, as are spacer elements 1530. Display element array 1500 does not include a specific "preferred arrangement" of display elements that forms a basic repeating unit of display element array 1500. However, the size, shape, and/or surface properties, as well as the relative proportions, of display elements 1510 and 1520 and spacer elements 1530 cause display element array to have an average distribution of display elements of different types across display element array 1500. Spacer elements 1530 interspersed between display elements 1510 and 1520 increase the mean distance between display elements.

Figure 32A:
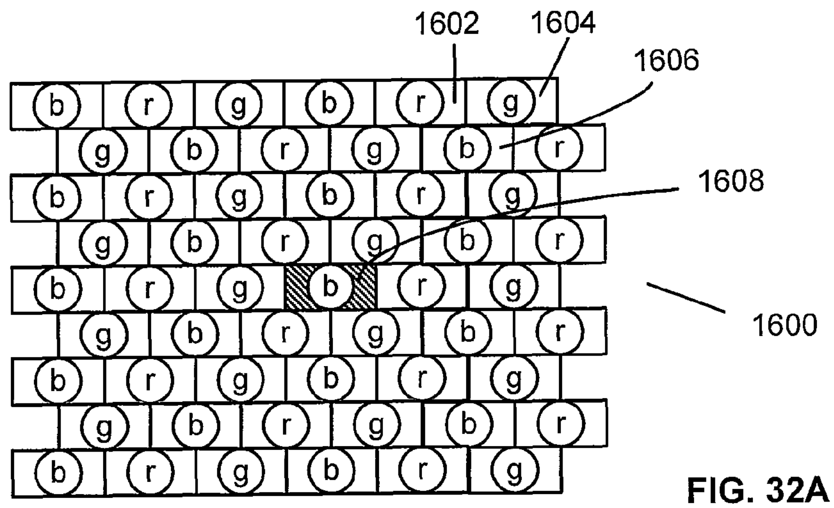
FIG. 32 illustrates a method of replacing display elements.
Figure 32B:
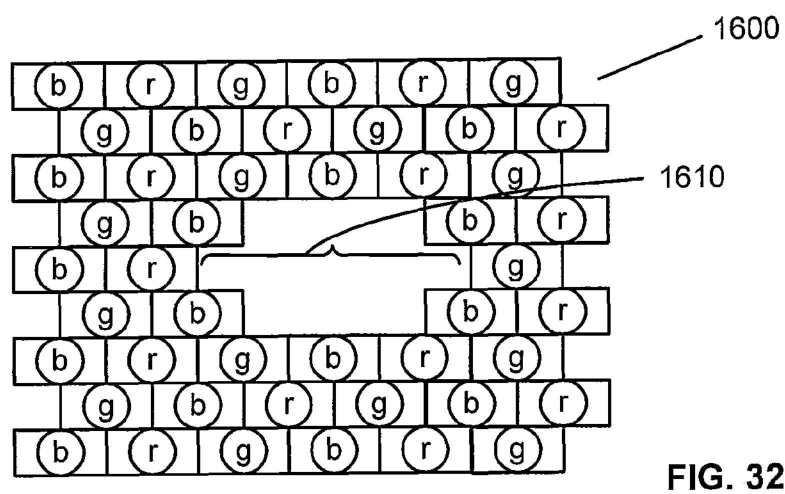
Figure 32C:
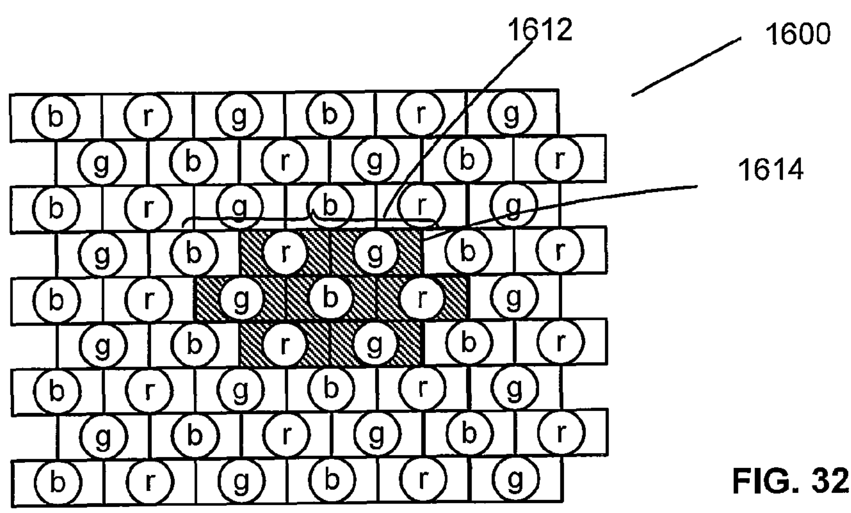

FIGS. 32A-32C illustrates a method of replacing defective or non-functional display elements. Display elements may be considered defective if they are partially or fully non-functional, functional but not connected properly, not positioned properly, or of the wrong type for the position in the array. The method may apply to single display elements or groups of display elements. The method may be used during the initial manufacture of the display element array, in connection with testing or troubleshooting, or may be adjusted for use post-manufacture, e.g., in the repair of damaged or worn out display element arrays. FIG. 32A, illustrates display element array 1600, made up of multiple display elements 1602, 1604, and 1606, of three different types, r, g, and b, respectively. Shaded display element 1608 is a defective display element of the 'b' type. In FIG. 32B depicts display element array following removal of defective display element 1608 as well as a number of adjacent display elements. Suitable methods for removing display elements from an assembled array will depend on the size and type of display elements, and will be known by those of skill in the art. In the case of small display elements, a moistened probe, for example, may be touched to the assembled array in the region of interest, and display elements may adhere to the probe by surface tension so they may be lifted from the assembled array. FIG. 32C illustrates display element array 1600 following a repair process. Void 11 in FIG. 32B has been filled by replacement portion 1612. Defective display element 1608 has been replaced by replacement display element 1614, which is of the correct type.

Figure 33:
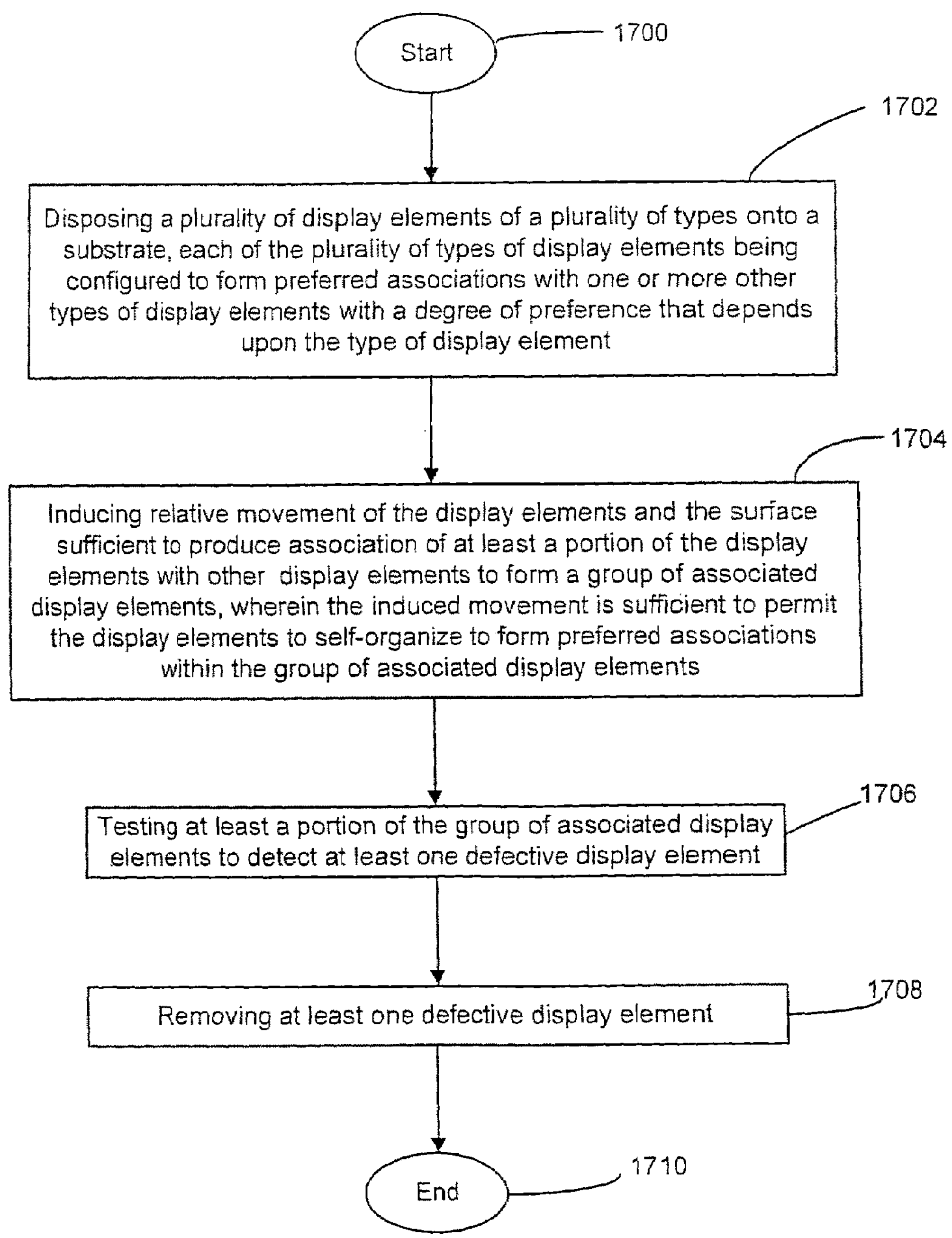
FIG. 33 is a flow diagram of the method of claim 32.

FIG. 33 outlines a subset of the steps of the method illustrated in FIGS. 32A-32C, incorporated into the method of manufacturing a display or repairing a previously manufactured display. At step 1702, a plurality of display elements of a plurality of types are disposed onto a substrate, each of the plurality of types of display elements being configured to form preferred associations with one or more other types of display elements with a degree of preference that depends upon the types of display element. At step 1704, relative movement of display elements and the surface sufficient to produce association of at least a portion of the display elements with other display elements to form a group of associated display elements is induced. The induced movement is sufficient to permit the display elements to self-organize to form preferred associations within the group of associated display elements. At step 1706, at least a portion of the group of associated display elements are tested to detect at least one defective display element. At step 1708, at least one defective display element is removed. Following step 1708, the array is in the state depicted in FIG. 32B, ready to have defective element(s) replaced.

Figure 34:
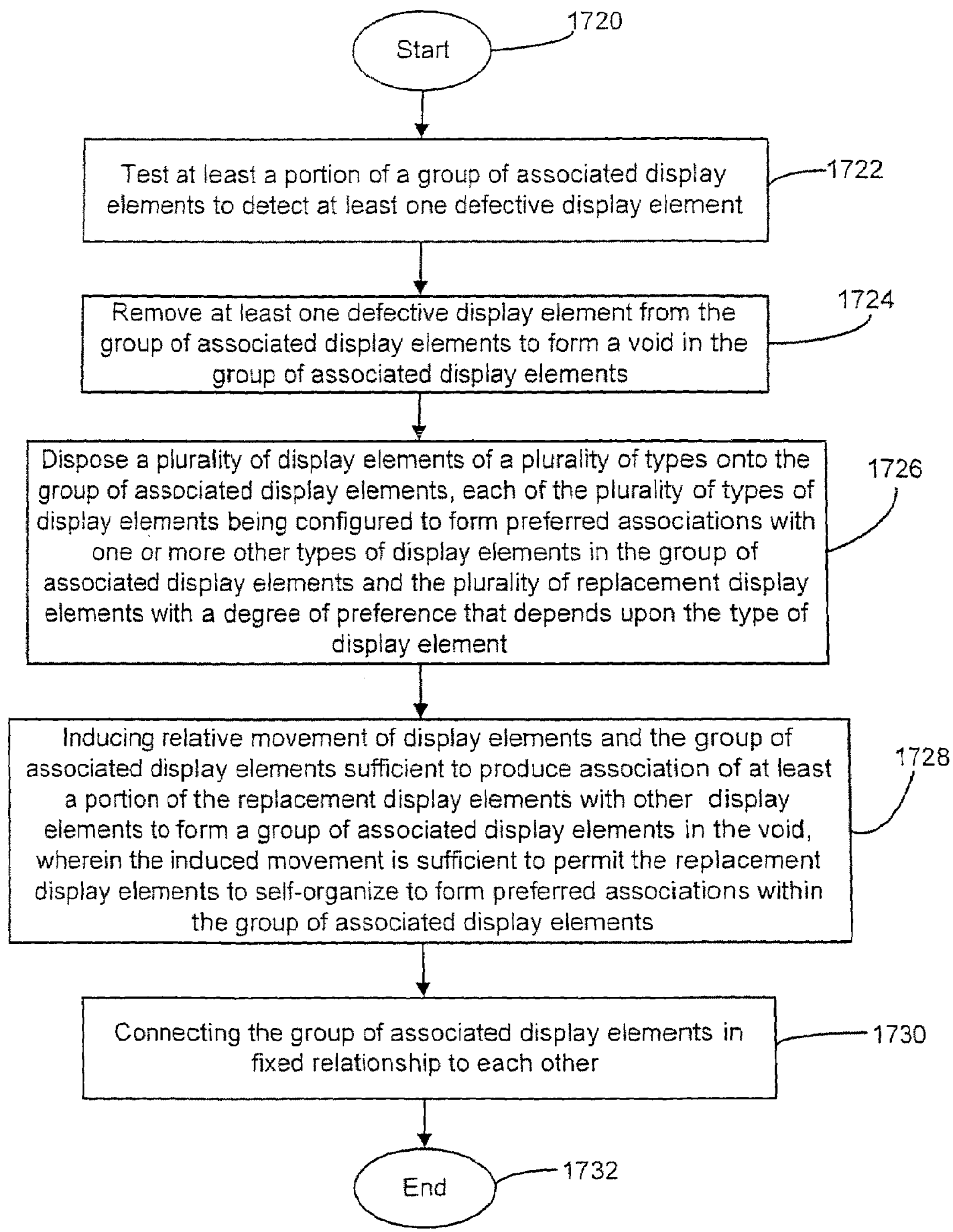
FIG. 34 is a flow diagram of a further method of replacing display elements.

FIG. 34 outlines another portion of the process for replacing defective display elements, beginning with testing at least a portion of a group of associated display elements to detect at least one defective display element at step 1722. At step 1724, at least one defective display element is removed from the group of associated display elements. More than one display element may be removed. If a group of display elements is removed which contains at least one defective display element, some of the removed display elements may not be defective. Following step 1724, the array is in the state depicted in FIG. 32B. The repair or reconstruction of the array proceeds as follows: at step 1726, a plurality of replacement display elements of a plurality of types are disposed onto the group of associated display elements. Each of the plurality of types is configured to form preferred associations with one or more other types of display elements in the group of associated display elements and the plurality of replacement display elements, with a degree of preference that depends upon the type of display element. The plurality of replacement display elements may be at least sufficient in number to fill the void left in the group of associated display elements by removal of the defective display element or elements. At step 1728, relative movement of the replacement display elements and the group of associated display elements is induced which is sufficient to permit self-organization of the replacement display elements to form preferred associations within the group of associated display elements. At step 1730, the group of associated display elements, now including one or more replacement display elements in place of the removed display elements, are connected in fixed relationship to each other.

With regard to the hardware and/or software used in the control of displays according to the present image, and particularly to the control of light generation by display elements within such displays, those having skill in the art will recognize that the state of the art has progressed to the point where there is little distinction left between hardware and software implementations of aspects of such systems; the use of hardware or software is generally (but not always, in that in certain contexts the choice between hardware and software can become significant) a design choice representing cost vs. efficiency or implementation convenience tradeoffs. Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will require optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be implicitly understood by those with skill in the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the capabilities of one of skill in the art in light of this disclosure. In addition, those skilled in the art will appreciate that certain mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., links carrying packetized data).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices for displaying or otherwise presenting information in the fashion set forth herein, and thereafter use standard engineering practices to integrate such described devices and/or processes into displays or other light emitting or modulating devices as exemplified herein. That is, at least a portion of the devices and/or processes described herein can be integrated into a display or other light emitting or modulating device containing system via a reasonable amount of experimentation.

Those having skill in the art will recognize that such systems generally include one or more of a memory such as volatile and non-volatile memory, processors such as microprocessors and digital signal processors, computational-supporting or -associated entities such as operating systems, user interfaces, drivers, sensors, actuators, applications programs, one or more interaction devices, such as data ports, control systems including feedback loops and control implementing actuators (e.g., devices for sensing position and/or velocity and/or acceleration or time-rate-of-change thereof; control motors for moving and/or adjusting components and/or quantities). A typical display system may be implemented utilizing any suitable available components, such as those typically found in appropriate computing/communication systems and/or light emitting systems, combined with standard engineering practices.

The foregoing-described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

While particular aspects of the present subject matter described herein have been shown and described, it will be obvious to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" and/or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense of one having skill in the art would understand the convention (e.g., "a system having at least one of A, B, and C" would include but not be limited to systems that have A alone, B alone, C alone, A and B together, A and C together, B and C together, and/or A, B, and C together). In those instances where a convention analogous to "at least one of A, B, or C, etc." is used, in general such a construction is intended in the sense of one having skill in the art would understand the convention (e.g., "a system having at least one of A, B, or C" would include but not be limited to systems that have A alone, B alone, C alone, A and B together, A and C together, B and C together, and/or A, B, and C together).

Although the methods, devices, systems and approaches herein have been described with reference to certain preferred embodiments, other embodiments are possible. As illustrated by the foregoing examples, various choices of display element and display system—configuration may be within the scope of the invention. As has been discussed, the choice of system configuration may depend on the intended application of the system, the environment in which the system is used, cost, personal preference or other factors. Display design, manufacture, and control processes may be modified to take into account choices of display element components and configuration, and such modifications, as known to those of skill in the arts of display design and construction, may fall within the scope of the invention. Therefore, the full spirit or scope of the invention is defined by the appended claims and is not to be limited to the specific embodiments described herein.

The invention claimed is:

1. A multi-element display comprising a plurality of display elements in a self-organized array disposed on a substrate, said plurality of display elements comprising two or more types of display elements self-organized by type into a preferred arrangement in which the position of display elements of each type relative to display elements of other types is specified, display elements of each type characterized by at least one surface or shape property that promotes association with other display elements to form said preferred arrangement via direct interaction between said at least one surface or shape property and at least one surface or shape property of another display element.

2. The multi-element display of claim 1, wherein said substrate comprises a surface having a surface characteristic that influences the spatial distribution of display elements of different types on said surface.

3. The multi-element display of claim 2, wherein said surface characteristic includes one or more of a surface charge, surface energy, magnetic property, binding affinity of a biomolecule, surface shape, or surface texture.

4. The multi-element display of claim 1, wherein said substrate includes a rigid material.

5. The multi-element display of claim 2, wherein said substrate includes a flexible material.

6. The multi-element display of claim 1, wherein said substrate includes a fluid.

7. The multi-element display of claim 1, wherein each said type of display element has a light spectral characteristic.

8. The multi-element display of claim 7, wherein said light spectral characteristic comprises a light absorption spectrum.

9. The multi-element display of claim 7, wherein said light spectral characteristic comprises a light emission spectrum.

10. The multi-element display of claim 7, wherein said light spectral characteristic comprises a light reflection spectrum.

11. The multi-element display of claim 1, wherein each said type of display element differs from at least one other type of display element by one or more characteristics including size, shape, wavelength band envelope, spectral width, power, emission pattern, polarity, response speed, or linearity.

12. The multi-element display of claim 1, wherein display elements of different types are distributed spatially non-uniformly within said display.

13. The multi-element display of claim 12, wherein display elements are distributed spatially non-uniformly with respect to size.

14. The multi-element display of claim 12, wherein display elements are distributed spatially non-uniformly with respect to wavelength band.

15. The multi-element display of claim 1, wherein said at least one surface or shape property comprises a surface charge.

16. The multi-element display of claim 1, wherein said at least one surface or shape property comprises a surface energy.

17. The multi-element display of claim 1, wherein said at least one surface or shape property comprises a magnetic property.

18. The multi-element display of claim 1, wherein said at least one surface or shape property comprises a binding affinity of a biomolecule.

19. The multi-element display of claim 18, wherein said biomolecule includes a nucleotide sequence.

20. The multi-element display of claim 18, wherein said biomolecule includes a amino acid sequence.

21. The multi-element display of claim 1, wherein said at least one surface or shape property comprises a concavity.

22. The multi-element display of claim 1, wherein said at least one surface or shape property comprises a convexity.

23. The multi-element display of claim 1, wherein display elements of each type are characterized by a combination of characteristic shape and characteristic surface property adapted for forming preferred associations with one or more other types of display element with a degree of preference that depends upon the type of display element.

24. The multi-element display of claim 1, configured as at least one of a television screen, a computer monitor, a video screen, a sign, a decorative item, an item of apparel, a decorative pattern region on an item of manufacture, or a functional pattern region on an item of manufacture.

25. The multi-element display of claim 1, including at least one spacer element located between two or more of said display elements.

26. The multi-element display of claim 25, wherein said at least one spacer element is characterized by at least one surface or shape property that promotes association of said spacer element with said display elements to move to a preferred location with respect to said plurality of display elements within said preferred arrangement.

* * * * *